United States Patent [19]

Balyoz et al.

[11] 4,295,149
[45] Oct. 13, 1981

[54] MASTER IMAGE CHIP ORGANIZATION TECHNIQUE OR METHOD

[75] Inventors: John Balyoz, Hopewell Junction; Chi S. Chang, Wappingers Falls; Barry C. Fox, Poughkeepsie; John A. Palmieri, Wappingers Falls; Majid Ghafghaichi, Poughkeepsie; Teh-Sen Jen, Fishkill; Donald B. Mooney, Poughkeepsie, all of N.Y.

[73] Assignee: International Business Machines Corporation, Armonk, N.Y.

[21] Appl. No.: 974,576

[22] Filed: Dec. 29, 1978

[51] Int. Cl.³ .................................. H01L 27/10
[52] U.S. Cl. ............................. 357/45; 357/40; 357/46; 357/51; 357/55; 357/68; 357/71
[58] Field of Search ............... 357/40, 45, 46, 51, 357/55, 68, 71

[56] References Cited

U.S. PATENT DOCUMENTS 4,234,888 11/1980 Calhoun et al. ................ 357/45
4,249,193 2/1981 Balyoz et al. .................. 357/45

Primary Examiner—Edward J. Wojciechowicz
Attorney, Agent, or Firm—Wesley DeBruin

[57] ABSTRACT

Disclosed are improved LSI semiconductor design structures termed "Master Image Chip Organization Techniques". Utilizing the technique provides increased density and optimized performance of semiconductor devices, circuits, and part number functions.

In accordance with the disclosed Master Image Chip Organization Method the semiconductor chips are optimally structured to facilitate the maximum number of devices and circuits, and to facilitate fabrication of a wide variety of LSI part numbers. Essentially, none of the semiconductor surface is dedicated for signal and power wiring channels. A master image wiring structure is provided which resides over the semiconductor surface and beneath a power surface. In addition, the master image wiring structure provides a means for personalizing power and signal wiring for a multiple power surface structure. The combined master image structure provides a means for optimally allocating semiconductor area for devices, functional units (micro and macro) and signal and power wiring to facilitate improved density and performance.

6 Claims, 19 Drawing Figures

BASIC CURRENT SWITCH EMITTER FOLLOWING CIRCUIT WITH IN-PHASE AND OUT OF-PHASE OUTPUTS
(4 INPUTS, 2 OUTPUTS)

STL – 4 WAY AOI
CELL LAYOUT

STL-4 WAY AOI LOGIC DIAGRAM

MASTER IMAGE CHIP ORGANIZATION TECHNIQUE OR METHOD

DESCRIPTION

Technical Field

This invention relates to improved LSI semiconductor design structures fabricated in accordance with the novel Master Image Chip organization technique. The disclosed technique, including method of fabricating and structure, provides improved large scale integrated circuit devices.

A primary object of the invention is to provide an improved large scale integrated circuit semiconductor device.

A primary object of the invention is to provide an improved method of fabricating large scale integrated circuit semiconductor devices.

A primary object of the invention is to provide an improved method of fabricating large scale integrated semiconductor devices in accordance with a Master Image Chip Organization.

A further primary object of the invention is to provide an improved large scale integrated circuit semiconductor device fabricated in accordance with Master Image Chip Organization.

A further object of the invention is to provide improved wiring density on large scale integrated circuit semiconductor chips fabricated in accordance with Master Image Chip Organization.

A further object of the invention is to provide improved circuit density of the large scale integrated circuit semiconductor devices fabricated in accordance with Master Image Chip Organization.

Another object of the invention is to provide improved large scale integrated circuit semiconductor devices in accordance with Master Image design techniques to provide increased circuit density and wiring density.

Another object of the invention is to provide in accordance with Master Image design techniques a plurality of semiconductor chips wherein essentially the entire semiconductor surface area of each chip is utilized to provide functional circuits.

Another object of the invention is to provide in accordance with Master Image design techniques a plurality of semiconductor chips wherein essentially the entire semiconductor surface area of each chip is utilized to provide functional circuits and minimally spaced wiring on a fixed grid is employed to interconnect said functional circuits, whereby an improved large scale integrated circuit is readily fabricated by employing a computer controlled electronic design system (E.D.S.).

Cross-Reference to U.S. Patent and Co-Pending Applications

U.S. Pat. No. 4,027,246, entitled "Automated Integrated Circuit Manufacturing System", granted May 31, 1977 to G. A. Caccoma et al., and of common assignee herewith.

U.S. Patent application Ser. No. 909,605, entitled "Improved LSI Semiconductor Device and Fabrication Thereof", filed May 25, 1978 by John Balyoz et al, and of common assignee herewith, granted as U.S. Pat. No. 4,249,193 on Feb. 3, 1981.

U.S. Patent application Ser. No. 830,715, entitled Integrated Circuit Layout Utilizing Separated Active Circuit and Wiring Regions, filed Sept. 6, 1977 by J. Balyoz et al and of common assignee herewith, published Apr. 7, 1981 as U.S. Defensive Publication No. T100501.

U.S. Patent application Ser. No. 827,912, entitled Tantalum Semiconductor Contacts and Method for Fabricating Same, filed Aug. 26, 1977 by H. M. Dalal et al and of common assignee herewith, granted as U.S. Pat. No. 4,215,156 on July 29, 1980.

Background of the Invention and Description of the Prior Art

The present invention relates to semiconductor integrated circuits, and more particularly, to Large Scale Integrated (LSI) circuits comprising a plurality of mutually interconnected functional circuits on a single semiconductor chip and wherein at least one fixed space X-Y wiring grid is employed. The invention also includes an improved method of fabricating the improved semiconductor devices.

A semiconductor integrated circuit consists of functional circuits integrally formed on a single semiconductor substrate, so that circuit means using integrated circuits are characterized by their miniaturized dimensions and a remarkably high reliability in operation. Accordingly, semiconductor integrated circuits are extremely valuable in numerous applications and fields. For example, in data processing systems wherein the object is to process data, or information, with accuracy as well as at a high speed. Thus, most of the circuits and specifically logic circuits or the like, in use are in the form of integrated circuits. In the art of semiconductor devices, dedicated and intense efforts have been made, and continue to be made, to increase the density of integration of circuit components formed on a single semiconductor substrate, or chip. With the progress of integrated circuit manufacturing techniques these efforts have resulted in a far more extensive function being performed by a single integrated circuit chip. In the art the term "cell" or "unit cell" is used to designate a fundamental functional circuit (semiconductor structure) which is employed to construct a more extensive circuit, subsystem or system. For example, the unit cell may be an AND circuit, a NAND circuit, an OR circuit, Flip-Flop circuit or the like. The term "LSI circuit" is used to designate a circuit including a plurality (sizeable number) of interconnected unit cells formed on a single semiconductor substrate, or chip. The term "LSI circuit" is also used to designate a much greater number of integrated circuit components as compared with a unit cell. Conceptionally, the LSI circuit may be considered a development or extension of the conventional integrated circuit. However, practically, since in the LSI circuit a very sizeable number of circuit components must be contained on one substrate, a number of complications, in particular, cell size, cell content, cell configuration, wiring (interconnections) etc., must be carefully and fully addressed. These complications and problems, and in particular, wiring (interconnections) are not nearly so serious or acute, and are more readily solved at this time in the fabrication of conventional integrated circuits. In the fabrication of conventional integrated circuits the custom design approach, or techniques, have been very effective: (Where the custom design approach, or technique, as is well known in the art, may be defined as the maximum utility of the area of the semiconductor substrate, or chip, for only a portion of the circuits implemented on a particular substrate, or chip, by individually designing the component location and metallization connection for each required circuit). The custom design approach has been and is effective in the fabrication of conventional integrated circuits. The custom design approach usually results in an overall less dense substrate, or chip, due to less dense wiring between densely designed groups of circuits. Also the custom design approach requires a very sizeable amount of time and effort to design a particular system or subsystem. The custom approach is not practical in the fabrication of many large scale integrated (LSI) semiconductor devices where the circuit density is very high, the system circuit is complicated, and extensive, dense, complicated wiring is required. One of the strongest reasons the custom design approach is not particularly suited or efficient for LSI semiconductor devices is that the custom design approach necessitates designing, for each individual LSI circuit (or part number) both impurity diffusion masks for forming the circuit elements and interconnection masks for interconnecting the circuit elements.

In order to obviate the deficiencies in the custom design approach a number of approaches have been proposed and utilized in the art. One such approach is the masterslice design approach. In the masterslice design approach, a great number of circuit elements or unit cells are formed and arranged on a substrate beforehand so as to be able to obtain by modifying the interconnection metallization patterns a number of different LSI circuits (LSI semiconductor devices or part numbers). It will be apparent, as known in the art, that any one of a number of desired LSI circuits may be fabricated by properly interconnecting the already formed and arranged circuit elements, or cells. The masterslice design approach is advantageous in that the same diffusion mask (or masks) can be used to produce a plurality of different LSI circuits (LSI semiconductor devices or part numbers) merely by designing appropriate masks for effecting metallization for each part number or different LSI circuit. Providing interconnection metallization is the final fabrication step or steps in the process of producing LSI semiconductor devices. As stated earlier herein, the custom design approach and masterslice design approach for providing LSI semiconductor devices are respectively well known to persons skilled in the art.

With reference to U.S. Patent numbers, additional prior art disclosures and teachings in the field of integrated circuits are briefly discussed.

Reference is made to U.S. Pat. No. 3,312,871, entitled "Interconnection Arrangement for Integrated Circuits" granted Apr. 4, 1967 to H. Seki et al., and of common assignee herewith. In the preferred embodiment of the invention disclosed in the Seki et al., patent active elements are formed in a coordinate array on the semiconductor wafer, and a plurality of first level conductors, either metallized or diffused, is formed in spaced parallel relationship between adjacent columns of such array; in addition, a second plurality of first level conductors is formed in spaced parallel relationship between corresponding active elements in adjacent rows of such array. Selected ones of the first plurality and each of the second plurality of first level conductors are preferably aligned, but unconnected, with opposing terminals of adjacent active elements in the array. In accordance with a particular feature of the Seki et al., invention, selected first level conductors are formed in discontinuous fashion, or segmented, whereby the opposing terminals of adjacent active devices can be independently connected to satisfy design requirements. A thin dielectric film is formed over the first level conductors and defines a coordinate hole pattern providing access to selected portions of each first level conductor. In accordance with the Seki et al. invention, maximum flexibility is achieved by depositing selected patterns of second level metallized conductors over the thin dielectric film to electrically connect selected first level conductors and also, selected terminals of the active elements and aligned first level conductors. Thus, the functional interconnection of the active devices is determined solely by the patterns of the second level conductors, such pattern being readily changeable to provide a desired system function. Only second level conductors required to effect the functional interconnection of the active elements need be deposited. In certain prior art structures, flexibility in large scale functional interconnection of active elements is a three dimensional proposition, requiring numerous cross overs. In the interconnection arrangement of Seki et al., however, flexibility is reduced to a one-dimensional proposition since operative interconnection of the circuit elements is determined by the pattern of second level conductors.

Reference is made to U.S. Pat. No. 3,377,513, entitled "Integrated Circuit Diode Matrix" granted Apr. 9, 1968 to R. M. Ashby et al. The Ashby et al. patent discloses a microminiature integrated circuit diode matrix fabricated on a single crystal, electrically insulated substrate. A plurality of diode elements are disposed atop the substrate to form a high density array. A first set of electrical conductors also is disposed on the substrate, each conductor being electrically connected to one terminal of each diode in the corresponding row of the matrix. A second set of conductors, electrically insulated from the first set, crosses the first set. Each conductor of the second set is electrically connected to the second terminal of preselected ones of the diode elements in the corresponding column.

Reference is made to U.S. Pat. No. 3,423,822 entitled "Method of Making Large Scale Integrated Circuit" granted Jan. 28, 1969 to I. A. Davidson et al. Large scale integrated circuitry is described in which a circuit is constructed of a number of elemental function blocks or EFB's. Each separate EFB is multiplicated to form a plurality of clusters, each cluster, corresponding to one of the EFB's required in the completed circuit. The EFB's are tested to choose one in each cluster and to reject all others in the cluster.

Reference is made to U.S. Pat. No. 3,475,621 entitled "Standardized High Density Integrated Circuit Arrangement and Method" granted Oct. 28, 1969 to A. Weinberger and of common assignee herewith. The Weinberger patent discloses a plurality of spaced parallel elongated diffusions of first conductivity type formed as a basic pattern on a semiconductor wafer surface of opposite conductivity type, each pair of adjacent diffusions defining one ground and one output diffusion of one or more insulated gate field effect transistors acting as input devices of a logical element. The ground diffusions are extensions of a common ground diffusion and each of the output diffusions is connected along an individual load device to a common power supply diffusion. "Personality" for generating a particular logical function is assigned by a single level metallization pattern formed over an insulating layer which defines the gate electrodes of input devices to the logical elements and, also, signal nets interconnecting the output diffusions of selected logical elements to input devices of other logical elements.

The input devices are distributed along the input channels of corresponding logical elements such that signal nets can pass therebetween and are confined over the semiconductor surface allotted to the basic diffusion pattern; only signal nets carrying inputs and outputs of the composite function generated by the logical elements need to be directed externally of the integrated arrangement of logical elements. In effect, the interconnection and active device areas of the integrated arrangement are overlapped such that the same area of the semiconductor surface can be utilized either to define an input device or for interconnection purposes. Such flexibility substantially improves packing density along with the attending reduction in wire length, circuit delay, etc., and readily adapts standard diffusion patterns to different circuit requirements.

Reference is made to U.S. Pat. No. 3,484,932 entitled "Method of Making Integrated Circuits" (original filing date Aug. 31, 1962) granted Dec. 23, 1969 to C. R. Cook, Jr. The Cook patent discloses a method of making integrated circuits in which a repetitive pattern of units are formed on a semiconductor slice with each unit comprising circuit elements to provide active and passive circuit element functions. Insulating material is provided on the slice in a pattern that exposes contact areas in each unit for interconnecting at least some of the circuit elements in that unit to provide a predetermined circuit function for that unit and the circuit elements of each unit are interconnected to provide the predetermined circuit function for that unit. Accordingly, the units on the slice may be formed by identical processing steps and the same masks, whereas different circuit functions are provided by the interconnecting metallization for the units.

Reference is made to U.S. Pat. No. 3,553,830 entitled "Method For Making Integrated Circuit Apparatus" granted Jan. 12, 1971 to F. J. Jenny et al., and of common assignee herewith. The Jenny et al. patent discloses a method for making integrated circuit apparatus wherein a plurality of integrated circuits are formed on at least one substrate and arranged in groups of circuits with each of the circuits of a particular group being functionally equivalent to the other circuits of the group. Next the circuits of the group are interconnected in a predetermined parallel operational relationship. The circuits of the group are then commenced to be tested in a sequential manner for one or more desired preselected electrical characteristics. When the first circuit or circuits as the case might be, of the group are found which have these characteristics, no further testing of the circuits of the group is performed. Thereafter, the circuits of the group are operatively disconnected from the parallel operational relationship with the exception of those circuit or circuits tested and found to have the characteristic(s).

Reference is made to U.S. Pat. No. 3,558,992 entitled "Integrated Circuit Having Bonding Pads Over Unused Active Area Components" granted Jan. 26, 1971. The Heuner et al. patent discloses an integrated circuit having a fixed number of active and passive semiconductor elements formed in a substrate. The elements may be interconnected to provide various circuit functions, such that one or more elements are not utilized in each different interconnection arrangement. The area over the elements not utilized is employed to provide bonding pads or cross over connections, thus saving area on the substrate surface.

Reference is made to U.S. Pat. No. 3,581,385 entitled "Method For Fabricating Large Scale Integrated Circuits with Discretionary Wiring" granted June 1, 1971 to J. W. Lathrop. The Lathrop patent discloses a method wherein a large scale array of integrated circuit units is fabricated by first determining the distortion in the scanning pattern generated by a computer controlled cathode ray tube. Then an array of integrated circuit units is fabricated on a single semiconductor slice in which the metallized contacts for individual integrated circuit units, and more particularly, the circuit units, are disposed generally in a pattern which is distorted to conform to the distortion in the scanning pattern of the cathode ray tube. The integrated circuit units are then individually tested in order to determine which of the units are operative and a photomask generated by means of the computer controlled cathode ray tube. Finally, a metal film is deposited over the slice and patterned by a photolithographic process using the photomask to form leads interconnecting the operative integrated circuit units into a common logic system.

Reference is made to U.S. Pat. No. 3,598,604 entitled "Process of Producing An Array of Integrated Circuits on Semiconductor Substrate" granted Aug. 10, 1971 to A. H. DePuy and of common assignee herewith. In the DePuy patent an inventory of masks is made for each set suitable for one of the successive processing steps used to make the array of patterns on the substrate. These masks are inspected to determine the location of defects on them. The location of the mask defects is recorded on a suitable medium. The location of the mask defects in masks for the plurality of processing steps is compared using the recorded location of the defects. Based on the comparison, a combination of one mask for each of the plurality of processing steps is selected which will minimize the number of defective integrated circuits in the array.

Reference is made to U.S. Pat. No. 3,615,463 entitled "Process of Producing An Array of Integrated Circuits on Semiconductor Substrate" granted Oct. 26, 1971 to W. N. Kuschell and of common assignee herewith. As contrasted to the disclosure of the DePuy patent 3,598,604 wherein a combination of one mask for each of the plurality of processing steps is initially selected, the Kuschell patent discloses sequential mask matching. Sequential mask matching drastically reduces the number of comparisons required to match masks, yet obtains most of the improvement in yield of defect free patterns in an array that may be obtained by making all possible combinations of the masks for each level.

Reference is made to U.S. Pat. No. 3,618,201 entitled "Method of Fabricating LSI Circuits" granted Nov. 9, 1971 to T. Makimoto et al. The Makimoto patent discloses a method including the steps of forming an array of plural unit cells in the surface of a semiconductor wafer, testing each unit cell to obtain a distribution map of qualified unit cells having desired electrical characteristics, and achieving interconnection between the unit cells belonging to each block region in which a suitable number of qualified unit cells are concentrated, by the use of a suitable fixed metallization pattern mask. In this method as said fixed metallization pattern mask applied to said respective block regions, selective use is made of plural types of masks which are so designed as to correspond to plural types of block regions which differ from each other in respect of the expected number of qualified unit cells and arrangement thereof. That is, the map region is sectioned into a plurality of block regions so that a plurality of LSI circuits can effectively be established by the use of the previously prepared plural types of fixed metallization pattern masks, and the corresponding one of said fixed metallization pattern masks is applied on each block region to effect photoresist layer exposing treatment, thus achieving LSI interconnection.

Reference is made to U.S. Pat. No. 3,689,803 entitled "Integrated Circuit Structure Having A Unique Surface Metallization Layout" granted Sept. 5, 1972 to T. H. Baker et al and of common assignee herewith. The Baker et al patent discloses a planar semiconductor integrated circuit chip structure in which a plurality of regions of different conductivity types extend from a planar surface into the chip to provide the active and passive devices of the integrated circuit. A layer of insulative material covers the planar surface and a plurality of electrical contacts extend through openings in the insulative layer respectively to the previously described regions. A metallization is formed on the insulative layer which, in addition to interconnecting the devices in the circuit, also connects each of a plurality of voltage supplies having different voltage levels respectively to different regions through the contacts. The improvement resides in the combination of an isolation region of one conductivity type extending from the planar surface around the edge of the chip and forming P-N isolation junctions with abutting regions of opposite type which enclose the devices in the circuit. The isolation junctions must be spaced a predetermined minimum distance from the edge of the chip; this minimum distance is selected so that the possibility of edge defects from dicing or handling reaching an isolation junction located at the minimum distance is substantially nil. One of the voltage supplies is applied to the isolation region. The combination also includes a unique metallization pattern on the insulative layer wherein only metallization connected to the voltage supply already applied to the isolation region is located on the portion of the insulative layer between the edge of the chip and the minimum distance of the isolation junction from the edge.

Reference is made to U.S. Pat. No. 3,702,025 entitled "Discretionary Interconnection Process" granted Nov. 7, 1972 to A. I. Archer. Archer discloses a process wherein numerous identical or similar cells are formed into a continuous chain of such cells on a single semiconductor wafer. The cells are catalogued as either good or bad cells and then a layer of dielectric followed by a pattern of conductors is deposited over all of the cells. Connections are discretionarily made to the good cells by omitting to etch holes through the dielectric layer over the contacts of bads cells and by shorting across all cells and then removing the shorts across the good cells.

Reference is made to U.S. Pat. No. 3,707,036 entitled "Method for Fabricating Semiconductor LSI Circuit Devices" granted Dec. 26, 1972 to T. Okabe et al. The Okabe et al patent discloses the steps of forming on a substrate a plurality of unit cells each of which can be easily inspected to determine the unit cell characteristics and is composed of as large a number of circuit elements as possible, inspecting the characteristics of the respective unit cells, dividing a certain number of qualified unit cells into sub-unit cells each composed of one or more circuit elements, and then interconnecting said sub-unit cells and, if desired, undivided qualified unit cells into an LSI circuit device. According to Okabe et al., each unit cell includes a relatively large number of circuit elements and has interconnections, between said constituent circuit elements, respectively, whereby the inspection in the characteristics of the respective unit cells can be conducted easier than the inspection of more versatile unit cells.

Reference is made to U.S. Pat. No. 3,762,037, entitled "Method of Testing for the Operability of Integrated Semiconductor Circuits having A Plurality of Separable Circuits" granted Oct. 2, 1973 to T. H. Baker et al. Baker et al discloses a method for determining whether an integrated circuit chip containing a plurality of separable circuits is operable when one or more of the separable circuits is not functional. A chip including a plurality of discrete or separable circuits, each of which include means for selectively receiving and distributing a voltage level necessary to render the particular circuit operable, the chip further including a region of one type conductivity at said voltage level common to all of the discrete circuits is tested by a method which will insure that short circuits between a particular circuit found not to be functional and, therefore, not to be rendered operable and the common region will not inadvertently apply the voltage level from the common region to voltage receiving and distributing means in the non-functional circuit. All the discrete circuits are first tested to determine which are functional. Then those circuits which fail the functionality test are tested further to detect whether any of these failed circuits have electrical short circuits between the common region and the means for receiving and distributing said operable voltage level in the failed circuit. If any of the failed circuits have such a short, the chip is considered to be inoperative because such a short will inadvertently connect the failed circuit with the functional circuits.

Reference is made to U.S. Pat. No. 3,771,217 entitled "Integrated Circuit Arrays Utilizing Discretionary Wiring and Method of Fabricating Same" granted Nov. 13, 1973 to T. E. Hartman. Hartman discloses a plurality of spaced apart integrated circuits formed on a semiconductor substrate provided with metal terminals extending through an insulating layer. A multilayer network of conductive strips is formed between the integrated circuits upon a first area of the insulating layer. The integrated circuits and the conductive strips are tested for preferred electrical characteristics. In response to the results of the testing, a unique pattern of discretionary leads are formed over a second area of the insulating layer. The discretionary leads connect selected portions of the multilayer network and the terminals of the integrated circuits to form an integrated circuit array.

Reference is made to U.S. Pat. No. 3,795,972 entitled "Integrated Circuit Interconnections by Pad Relocation" granted Mar. 12, 1974 to D. F. Calhoun. The Calhoun patent discloses an integrated circuit wafer having arrays of circuits thereon, wherein each circuit is electrically tested to determine the location of usable circuits or good circuits. Then a layer of insulating material with feedthroughs to the pads of only selected usable circuits is formed over the circuits to expose only the pads of the good circuits and to isolate unusable circuits. Thereafter, in conformance with a master pattern defining where good circuits are desired, interconnect lines are laid down from the exposed pads of the usable circuits to sites of standardized specified pad locations either by manual techniques or in accordance with a computer program. As a result, the pads of usable circuits are effectively relocated to positions where usable circuits are specified in the master pattern, that is, each usable circuit is effectively relocated from its actual position to a specified or desired circuit position. Once the pads are relocated to conform to the standard or master pattern, one or more layers of standard masks for identically placed feedthroughs in layers of dielectric and standard patterns of conductors are fabricated on top of the array to interconnect the selected circuits.

Reference is made to U.S. Pat. No. 3,795,973 entitled "Multi-Level Large Scale Integrated Circuit Array Having Standard Test Points" Mar. 12, 1974 to D. F. Calhoun. The Calhoun patent discloses a complex multi-level integrated circuit array comprising a wafer having a plurality of cells in a rectilinear array and alternating layers of dielectric insulation, and metallization formed in a laminae on top of the wafer. Vias in a first layer of insulation expose pads of selected usable cells in a first layer of metallization to a second layer of metallization which is formed into individual conductors for effectively relocating the exposed pads of selected usable cells to master pattern cell locations where no usable cells are located, and further including "feed under" conductor segments formed over specified non-used cell locations. A second layer of insulation has vias at standard master pattern locations which expose the master pattern pads to a standard or master pattern of interconnect lines formed in a top layer of metallization which interconnect the cells into a functional circuit type. The standard pattern of interconnect lines has a plurality of test pads formed therein at standard locations for utilizing the same test pads and locations on all integrated circuits having the same part type and associated with the top layer standard mask.

Reference is made to U.S. Pat. No. 3,795,974 entitled "Repairable Multi-Level Scale Integrated Circuit" granted Mar. 12, 1974 to D. F. Calhoun. The Calhoun patent discloses a multi-level complex standard circuit comprising a wafer having a plurality of cells in a rectilinear array and alternate layers of dielectric insulation and metallization formed in a laminae on top of the wafer. Vias in the first layer insulation expose the pads of N+K (where N and K are integers) desired usable cells in a first layer of metallization on the wafer. The pads are electrically connected through the vias to a second layer of metallization which is formed into individual conductors. The conductors are routed for effectively relocating the exposed pads of selected usable cells to desired positions defined by master pattern circuit locations including those usable cells whose actual positions are not in registry with the desired positions defined by master pattern circuit locations. The second layer of metallization further includes "feed under" conductor segments formed over specified nonused locations. A second layer of insulation has vias at standard or master pattern cell locations which expose the master pattern pads of the N+K cells to a top layer of metallization that includes a standard master pattern of interconnect lines which interconnect N of the cells into a functional circuit. The master pattern of metallization further includes pads associated with K extra cells which are located at standard or master pattern cell locations. The extra cells can be utilized to replace faulty ones of the N interconnected cells by disabling, in the top layer of metallization, the interconnect lines associated with each faulty one of the N cells and connecting one of the extra cells to the disabled interconnect lines.

Reference is made to U.S. Pat. No. 3,795,975, entitled "Multi-Level Large Scale Complex Integrated Circuit Having Functional Interconnected Circuit Routed to Master Patterns" granted Mar. 12, 1974 to D. F. Calhoun. The Calhoun patent discloses a complex integrated circuit comprising a wafer having a plurality of cells each having signal connect pads in a first layer of metallization on the wafer and which have an imperfect yield of usable cells and further including a laminae of alternate layers of dielectric insulation and metallization formed on the wafer wherein: a first layer of insulation has vias formed therethrough to expose signal connect pads of selected usable cells; a second layer of metallization has conductors formed therein which operably interconnect the exposed signal connect pads of one or more groups of usable cells into individual functional circuits and, where needed, includes pad relocation conductors which route the signal connects of individual cells and the signal connects of interconnected groups of cells to master pattern circuit locations; a second layer of insulation has vias formed therethrough which expose signal connect portions at the master pattern circuit locations; and a third layer of metallization is formed into conductors that interconnect the signal connects at master pattern locations into a functionally specified circuit type.

Reference is made to U.S. Pat. No. 3,981,070 entitled "LSI Chip Construction and Method" granted Sept. 21, 1976 to F. K. Buelow et al. The Buelow et al. patent discloses an LSI chip construction having a semiconductor body with a plurality of transistors formed in the semiconductor body in a predetermined pattern and a plurality of resistors formed in the semiconductor body in a predetermined pattern. Means is provided which includes two layers of metallization having input and output pads adjacent the outer perimeter of the body and contacting said transistors and resistors to form a plurality of emitter follower circuits with certain of the emitter follower circuits being made up of larger transistors and being located near the perimeter of the chip and near the input output pads. The other emitter coupled circuits are clustered in groups to form an array of such groups with each of the groups being capable of containing a plurality of logic circuits.

Reference is made to U.S. Pat. No. 3,983,619 entitled "Large Scale Integrated Circuit Array of Unit Cells and Method of Manufacturing Same" granted Oct. 5, 1976 to M. Kubo et al. The Kubo et al patent discloses a semiconductor LSI array comprising a plurality of unit cells arranged in rows, each of which cells has operation terminals, input terminals and output terminals positioned in a standard relation. A set of runways are provided on the unit cells for each row so that the runways may be connected to corresponding operation terminals and that input terminals may be opposed to output terminals with respect to the runways.

Reference is made to U.S. Pat. No. 3,984,860 entitled "Multi-Function LSI Wafers" granted Oct. 5, 1976 to J. C. Logue and of common assignee herewith. In Logue's patent, a system that is to be placed on a wafer is partitioned into reasonably large size functional islands so as to minimize the interconnections between functions. Each function is provided with a set of I/O and power pads which are interconnected in accordance with the system design. The above wafer design is called "design A". A second wafer design (design B) that is the mirror image of design A is also constructed. Wafers of design A and B are produced and tested. The tested wafers are divided into two groups: group I wafers have relatively few functions that are inoperative; group II wafers have relatively few functions that are operative. A laser is used to cut out the bad functions from group I wafers. The cut is made inside the I/O and power pads. Similarly, a laser is used to cut out the good functions from group II wafers. This cut is made outside the I/O and power pads. The inoperative functions removed from group I wafers are discarded and the good functions removed from group II wafers are retained. Since wafer designs A and B are mirror images of each other, a given function on wafer A is also the mirror image of the same function on wafer B. Therefore, a given function from a group II wafer A (or B) can be inverted and attached to a group I wafer B (or A) that has the corresponding function removed from it. The I/O and power pads of the function removed from the group II wafer are joined to the I/O and power pads remaining on the group I wafer. In this way, group I wafers are made usable or may undergo engineering changes.

Reference is made to U.S. Pat. No. 3,993,934 entitled "Integrated Circuit Structure Having a Plurality of Separable Circuits" granted Nov. 23, 1976 to T. H. Baker et al. and of common assignee herewith. The Baker et al patent discloses a method for determining whether an integrated circuit chip containing a plurality of separable circuits is operable when one or more of the separable circuits is not functional. A chip including a plurality of discrete or separable circuits, each of which include means for selectively receiving and distributing a voltage level necessary to render the particular circuit operable, the chip further including a region of one type conductivity at said voltage level common to all of the discrete circuits is tested by a method which will insure that short circuits between a particular circuit found not to be functional and, therefore, not to be rendered operable and the common region will not inadvertently apply the voltage level from the common region to the voltage receiving and distribution means in the nonfunctional circuit. All the discrete circuits are first tested to determine which are functional. Then those circuits which fail the functionality test are tested further to detect whether any of these failed circuits have electrical short-circuits between the common region and the means for receiving and distributing said operable voltage level in the failed circuit. If any of the failed circuits have such a short, the chip is considered to be inoperative because such a short will inadvertently connect the failed circuit with the functional circuits.

Reference is made to U.S. Pat. No. 3,999,214 entitled "Wireable Planar Integrated Circuit Chip Structure" granted Dec. 21, 1976 to E. E. Cass and of common assignee herewith. The Cass patent discloses a planar semiconductor integrated circuit chip structure comprising a surface from which a plurality of regions of different conductivity types extend into the chip to provide the transistors and resistors wherein said transistors and resistors are arranged in a plurality of repetitive cells, each of said cells containing a sufficient number of transistors and resistors to form a selected type of logic circuit. The cells are arranged in an orthogonal array with the cells in substantially parallel rows in both orthogonal directions. The structure includes a level of metallization disposed above and insulated from the array by at least one layer of electrically insulative material. This level of metallization comprises a plurality of groups of substantially parallel lines respectively disposed above and running parallel to a corresponding plurality of interfaces between rows of said cells in one of the orthogonal directions. Each group of lines is connected to a plurality of cells abutting the interface below the group to provide interconnections between and voltage level supplies to said cells. In addition, this level of metallization includes a plurality of line patterns respectively disposed spaced from and between said groups and above the cells to provide intracell connections. With this arrangement, it is possible to have at one metallization level, the metallization lines required for the intracell connections and still provide channels spaced from the intracell connections wherein intercell metallization may be formed.

Reference is made to U.S. Pat. No. 4,006,492 entitled "High Density Semiconductor Chip Organization" granted Feb. 1, 1977 to E. B. Eichelberger et al and of common assignee herewith. The Eichelberger et al patent discloses a semiconductor chip layout including a plurality of logic cells arranged in columns. A cell may encompass one of two different magnitudes of area in the chip; and each column contains only cells having the same area. The layout is particularly appropriate for level sensitive logic systems (U.S. Pat. No. 3,783,254) which utilize both combinatorial as well as sequential networks. The combinatorial networks are less orderly and require a greater number of selectable input connections, hence more area, than the sequential circuits. The wide and narrow columnar architecture allows a much greater circuit packing density on a chip, resulting in a substantial increase in the number of circuits for a given chip area. Performance is also increased because of the reduced area required by the sequential circuits.

Reference is made to U.S. Pat. No. 4,032,962 entitled "High Density Semiconductor integrated Circuit Layout" granted June 28, 1977 to J. Balyoz et al and of common assignee herewith. The Balyoz et al patent discloses an integrated logic circuit having a novel layout in a semiconductor substrate. Each circuit includes a first device including an elongated impurity region and a set of other impurity regions either in, or in contiguous relationship with, the elongated region to form a set of diode junctions. The elongated region is capable of containing a predetermined maximum number of the other impurity regions. A second device is located adjacent the narrow side of said first device. A first set of first level conductors extends over the elongated region orthogonally with respect to the elongated direction and are interconnected to selected ones of the other impurity regions. Another conductor in a second level atop the substrate is connected to an impurity region of the second device and extends substantially parallel to the elongated direction. For the most part, this conductor connects the second device with one of the conductors in the first set. The reference potential connections to each circuit are also made preferably by conductive channels running in the same direction. With respect to chip architecture, each logic circuit is of substantially identical geometric form and arranged in columnar arrays.

Reference is made to U.S. Pat. No. 3,539,876 entitled "Monolithic Integrated Structure Including Fabrication Thereof" granted Nov. 10, 1970 to I. Feinberg et al and of common assignee herewith. The Feinberg et al patent discloses monolithic integrated structures including the fabrication thereof and, more particularly, a monolithic integrated structure that is used to provide a multiplicity of various circuit interconnections so as to permit more than one circuit to be made for each structure. Many logic type integrated structures can be fabricated from a single master slice configuration which contains a number of components in a pattern favorable to the formation of any selected logic circuit from a class of many such circuits. Additionally, fabrication techniques are described for facilitating formation of the integrated chip which include mask alignment techniques, chip testing techniques, chip identification, process step identification, engineering change number identification, etc.

Reference is made to U.S. Pat. No. 3,633,268, entitled "Method of Producing One or More Large Integrated Semiconductor Circuits", granted Jan. 11, 1972 to R. Engbert. The Engbert patent discloses a method of producing one or more integrated semiconductor circuits which consist of a plurality of basic circuits accommodated in a common semiconductor wafer, which method includes the steps of producing a plurality of like or different basic circuits in or on one semiconductor wafer with repeated use of the mask technique, measuring the characteristics of said basic circuits present on said semiconductor wafer, preserving the result of said measurements in a test record, composing a conductor mask necessary for producing conducting paths between said basic circuits from different individual masks by analyzing the test report, and finally producing the conducting paths extending over the surface of the semiconductor wafer and connecting the usable basic circuits electrically to one another by means of said composite conducting path mask.

As is apparent from the prior art discussed supra, there are numerous semiconductor device fabrication techniques, and approaches known to the art for the fabrication of semiconductor devices. At least certain of these techniques have been or are employed in the art. Known approaches may for convenience be generally classified as "custom", and "masterslice".

The interconnection metallurgy techniques, as known to the art, may be generally classified as "fixed", "discretionary" and "hybrid". Where "hybrid" is a wiring technique which at least in part combines the features of the "fixed" and "discretionary" techniques. Numerous wiring techniques, as generally classified supra have been employed in the art.

SUMMARY OF THE INVENTION

The invention disclosed in detail hereinafter is directed to an improved method of fabricating LSI semiconductor devices utilizing a Master Image Chip Organization technique and an improved LSI chip wiring technique. The practice of the method in accordance with the invention provides improved LSI semiconductor devices.

In accordance with the invention essentially the entire semiconductor surface area, with the exception of isolation regions between functional units and/or components, and a limited width border area at the perimeter of the chip, is utilized. The functional units and components on the chip surface area adjacently or closely spaced one to another. The space between the functional units and components having a very small surface width, is utilized to provide electrical isolation. Also, a narrow perimeter portion of the chip is not utilized. (This is the kerf portion of the chip prior to dicing and may have physical irregularities). The functional units and components contained on the chip may vary in size (area), configuration, component content, and intended circuit function.

Further, in accordance with the invention at least first and second orthogonal densely spaced wiring levels are utilized to provide an improved semiconductor device in the form of large scale integrated circuit having the following advantages and features: (1) increased circuit density with corresponding enhancement in scope of the system, logic, or memory function performed by a single integrated circuit chip; and (2) an integrated circuit chip containing a very large number of wireable functional circuit units and/or components where by utilizing Master Image Chip Organization techniques a very sizeable number of different "part numbers" may readily be fabricated.

As will be more fully appreciated from the more detailed description of an illustrative embodiment of the invention set forth hereinafter the invention encompasses an improved semiconductor device by utilizing known semiconductor process technology in conjunction with minimum functional circuit unit and/or component area in a configuration complementing a dense wiring scheme. Namely, in accordance with the invention the area configurations and dense wiring are preconceived to be utilized jointly to provide an improved semiconductor device.

The invention as further disclosed in detail hereinafter is directed to an improved method of structuring LSI semiconductor chips utilizing an improved semiconductor device technique and an improved LSI chip signal and power wiring technique. The practice of the method in accordance with the invention provides improved LSI semiconductor density and performance. In accordance with the invention essentially the entire semiconductor surface area is utilized for devices, signal and power wiring to accomplish fabrication of a chip part number. The kerf portion of the chip, which is a narrow perimeter portion on the chip boundary, is not utilized.

The invention described herein shows a master image (MI) which is a flexible image that allows personalization of (1) silicon diffusion levels; (2) voltage power bussing; and (3) circuit functions and interconnections. The master image technique includes at least one X and Y wiring grid. The X and Y wiring grids can exist on multiple wiring levels. An X wiring grid refers to a set of horizontal wiring channels whereas the Y wiring grid refers to a set of vertical channels. Namely, the X and Y wiring grids are orthogonal one to the other and separated by a layer of silicon (silicon dioxide) or the equivalent. These sets of wiring grids are sandwiched between silicon and power surfaces. The wiring grid resides over blank silicon and is sandwiched between the silicon surface and power surface. It will be appreciated that where multiple X and Y wiring grids are employed multiple power surfaces may, appropriately spaced, be employed.

In order to personalize power distribution and the I/O connections, access points to power surfaces and I/O surfaces must be defined. These access points are defined by the joint intersection of the power and I/O surface shapes and the wiring grids on top or bottom of these surfaces, the existence of these access points allows the power distribution and I/O's to be personalized on the wiring grid surfaces. This is accomplished by placing the required vias at the access points desired. The wiring grid allows voltage and I/O distribution systems to be designed as an integral number of channels.

Both the power and I/O signal connections are routed to end points which ultimately get terminated in doped silicon. These end points are defined as power and signal LST (Logic Service Terminal) points of a functional unit. A functional unit may comprise micro logic circuits as well as macro. The functional units comprised of multiple silicon diffusions are located in areas of the chip. A macro may be a RAM, PLA, Selector or Decoder. A functional unit, micro or macro has a set of components that required connection. These connections may be accomplished using any of the wiring grids. The connections between functional units, interfunctional connections, are accomplished using any of the wiring grids. The interfunctional unit connections start or end at access points to each functional unit defined by the LST locations. These LST access points are structured in such a manner so as to coincide with an X and Y wiring grid intersection. The location of the LST could be at the silicon level or at any of the multiple wiring levels defined.

A conventional or standard MS (masterslice) has a fixed limit on the number of internal and external circuits, and the circuits performance. This limit is based upon a fixed circuit cell and size locations as well as a fixed power distribution size and location. The Master Image Structure, in accordance with the invention, provides the ability to optimize each functional unit for performance and density, and place it almost anywhere on the chip. By having the functional unit LST's align themselves with the wiring grid the functional unit placement on the image is very flexible. Also, by having the power surface and I/O surface access points align with the wiring structure the voltage and I/O distribution cofiguration is very flexible. In particular, the voltage busses can be optimized for actual conditions of the part number by optimizing the size of the voltage bus and the location. The Master Image Structure described provides increased density and performance for an LST semiconductor chip.

The foregoing and other objects, features and advantages of the invention will be apparent from the following more particular description and preferred embodiments of the invention as illustrated in the accompanying drawings.

BRIEF DESCRIPTION OF THE DRAWINGS

FIG. 3 further illustrates the X-Y wiring grid and how each of the contacts to the functional units of the semiconductor chip are rigorously aligned with an X-Y intersection on the X-Y wiring grid.

FIG. 9A is Schottky Transistor Logic circuit diagram. Although six outputs are available from the Schottky diodes (S1 through S6) only a maximum of four may be used for any given circuit application.

FIG. 9B is a block diagram representative of the Schottky Transistor Logic circuit of FIG. 9A.

Figure 9:
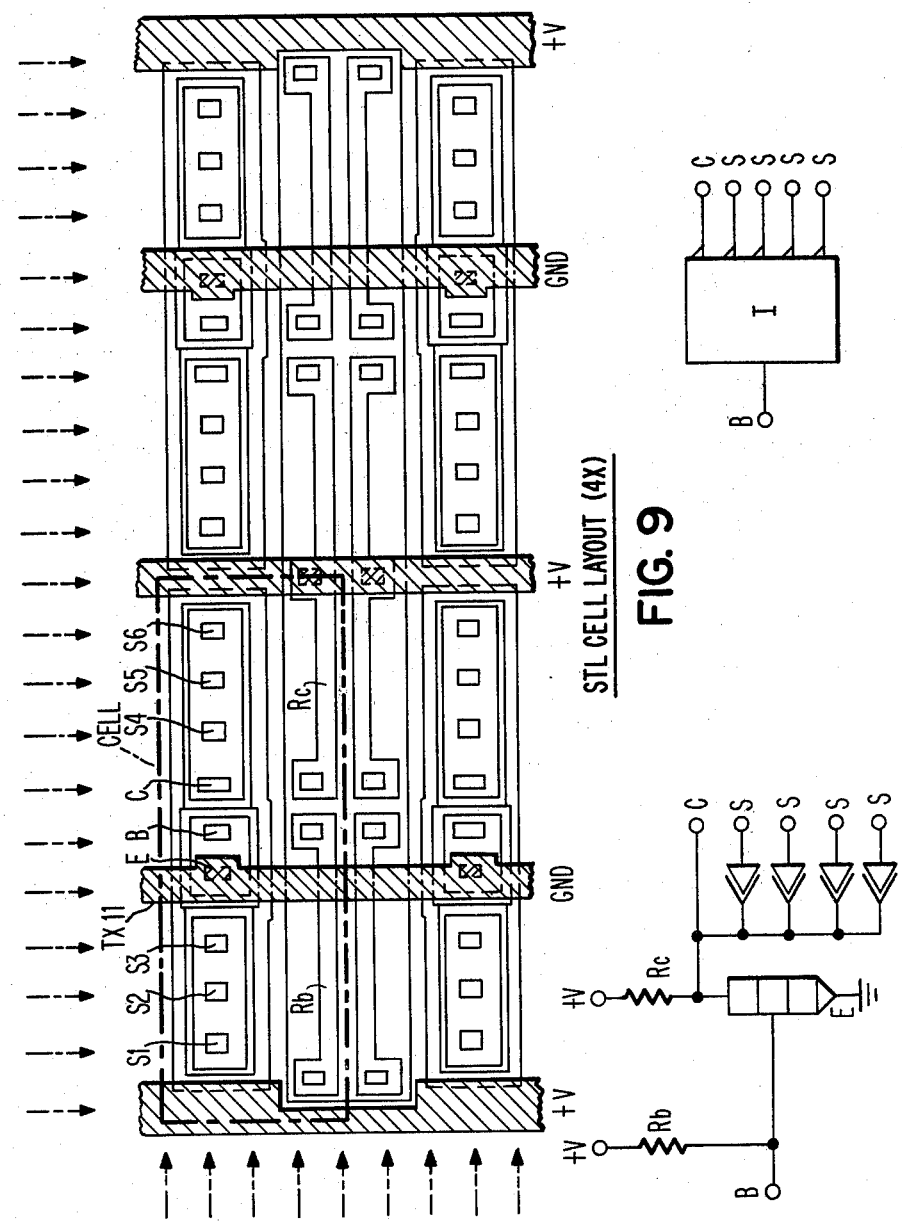
FIG. 9 is a planar layout of four Schottky Transistor Logic (STL) cells.

The structure, circuitry and block diagram of FIGS. 9, 9A and 9B are also, (and more fully) disclosed and explained in the afore-identified U.S. Patent application Ser. No. 909,605, granted as U.S. Pat. No. 4,249,193 on Feb. 3, 1981.

Figures 10, 10A:
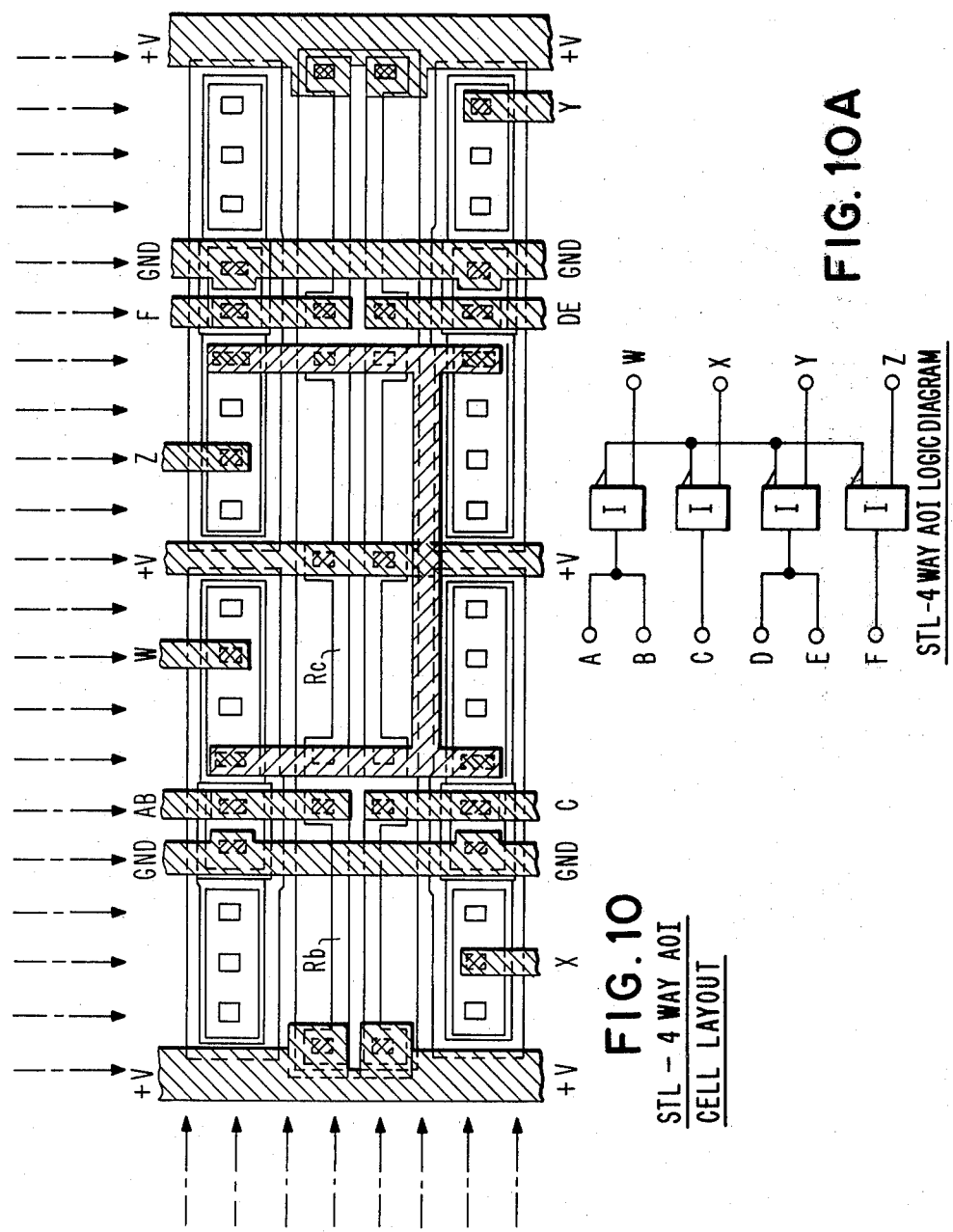

FIG. 10 illustrates how four STL cells (FIG. 9) are interconnected to provide a four way AND-OR-INVERT circuit.

FIG. 10A is a block diagram representation of the four way AND-OR-INVERTER circuit structure of FIG. 10.

Figure 11:
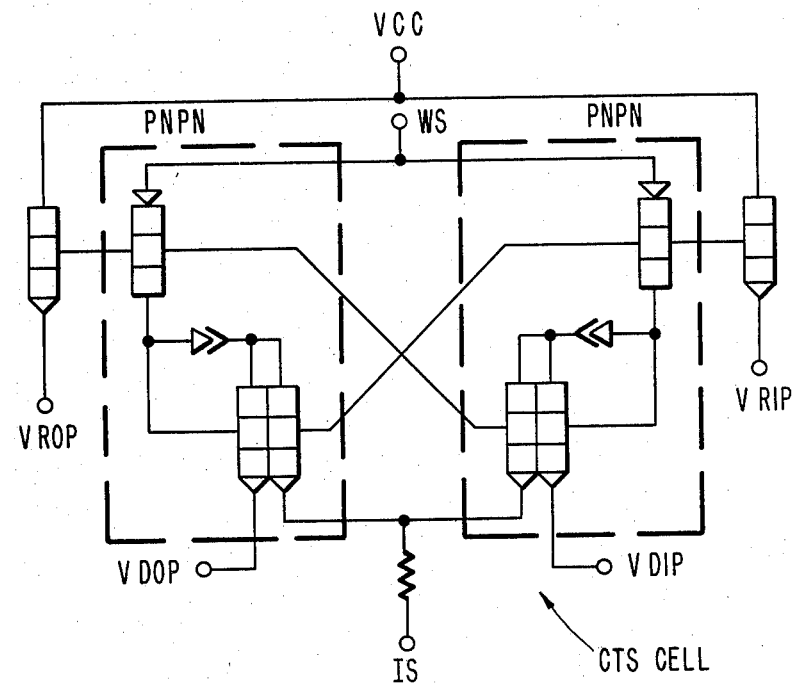

FIG. 11 is a circuit diagram of a Read/Write cell.

Figure 12:
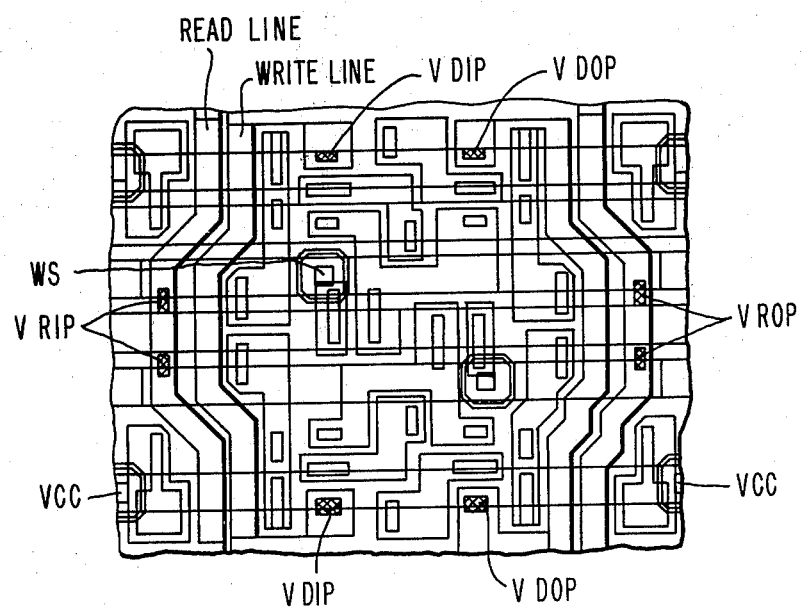

FIG. 12 is a planar layout of two Read/Write cells respectively corresponding in circuit diagram to FIG. 11.

Figure 5:
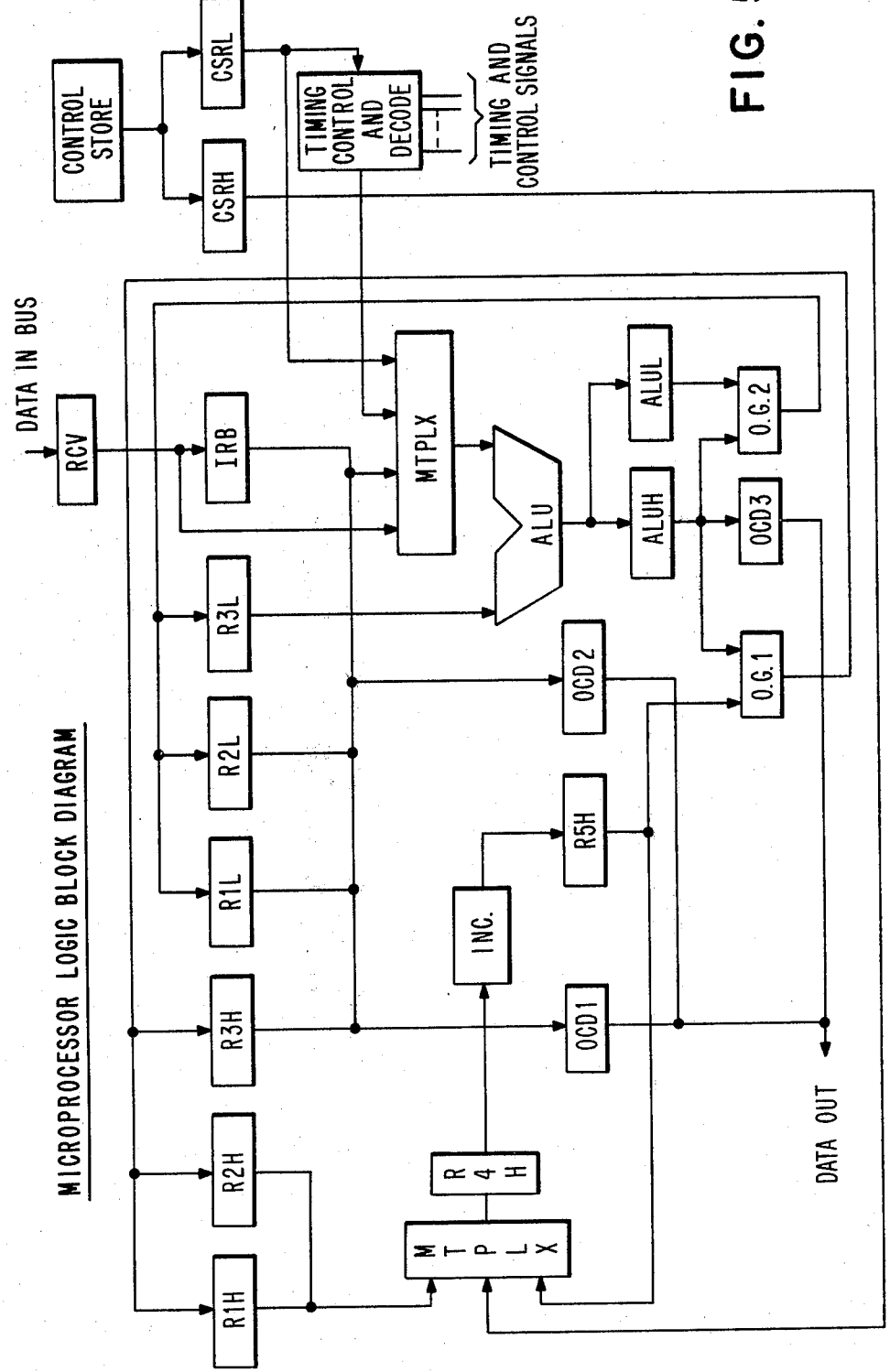
FIG. 5 is an illustration, in the form of a logic block diagram, of a typical microprocessor.
Figure 13:
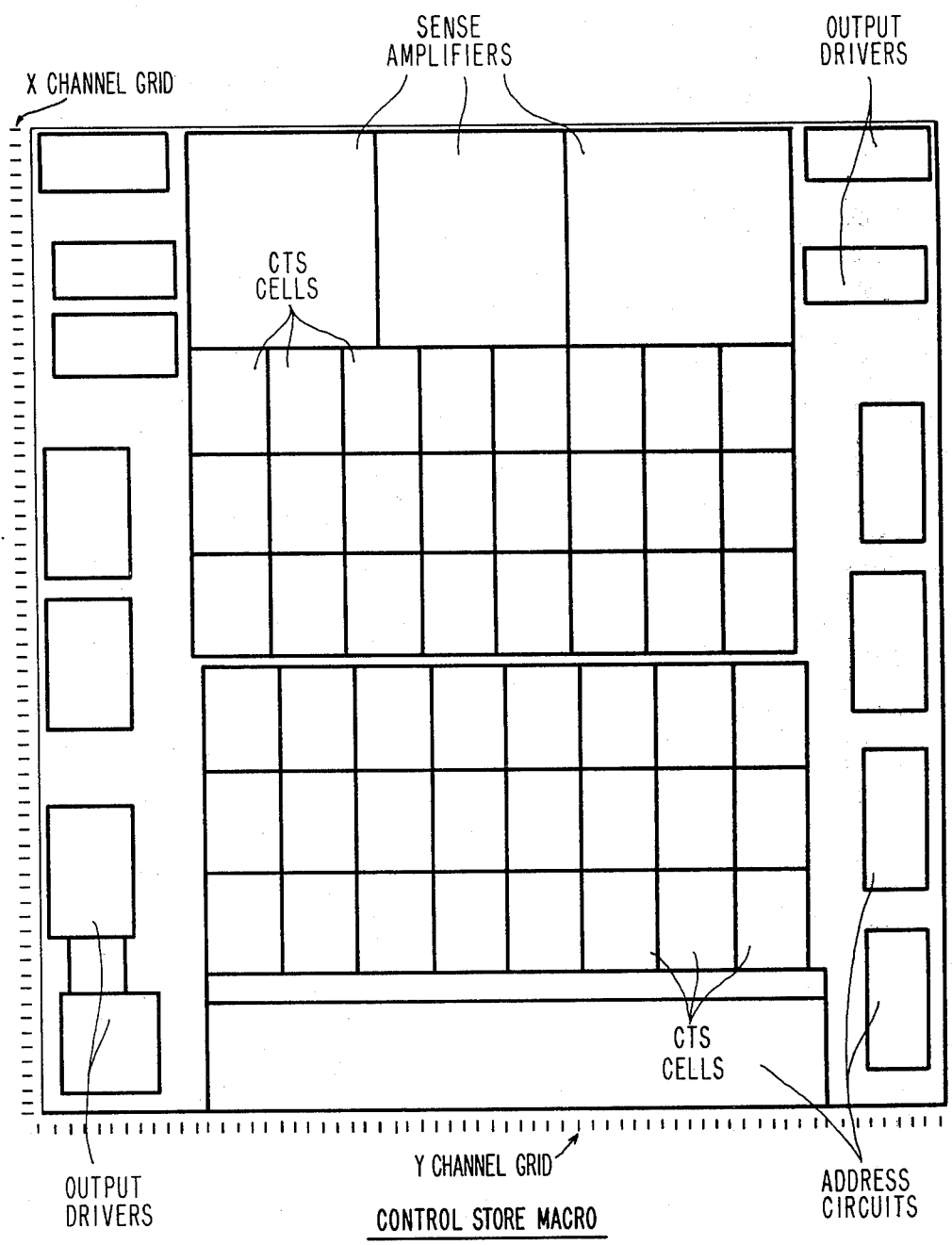

FIG. 13 is the layout of the writeable control store (without metallization) utilized in the microprocessor of FIG. 5.

Figure 14:
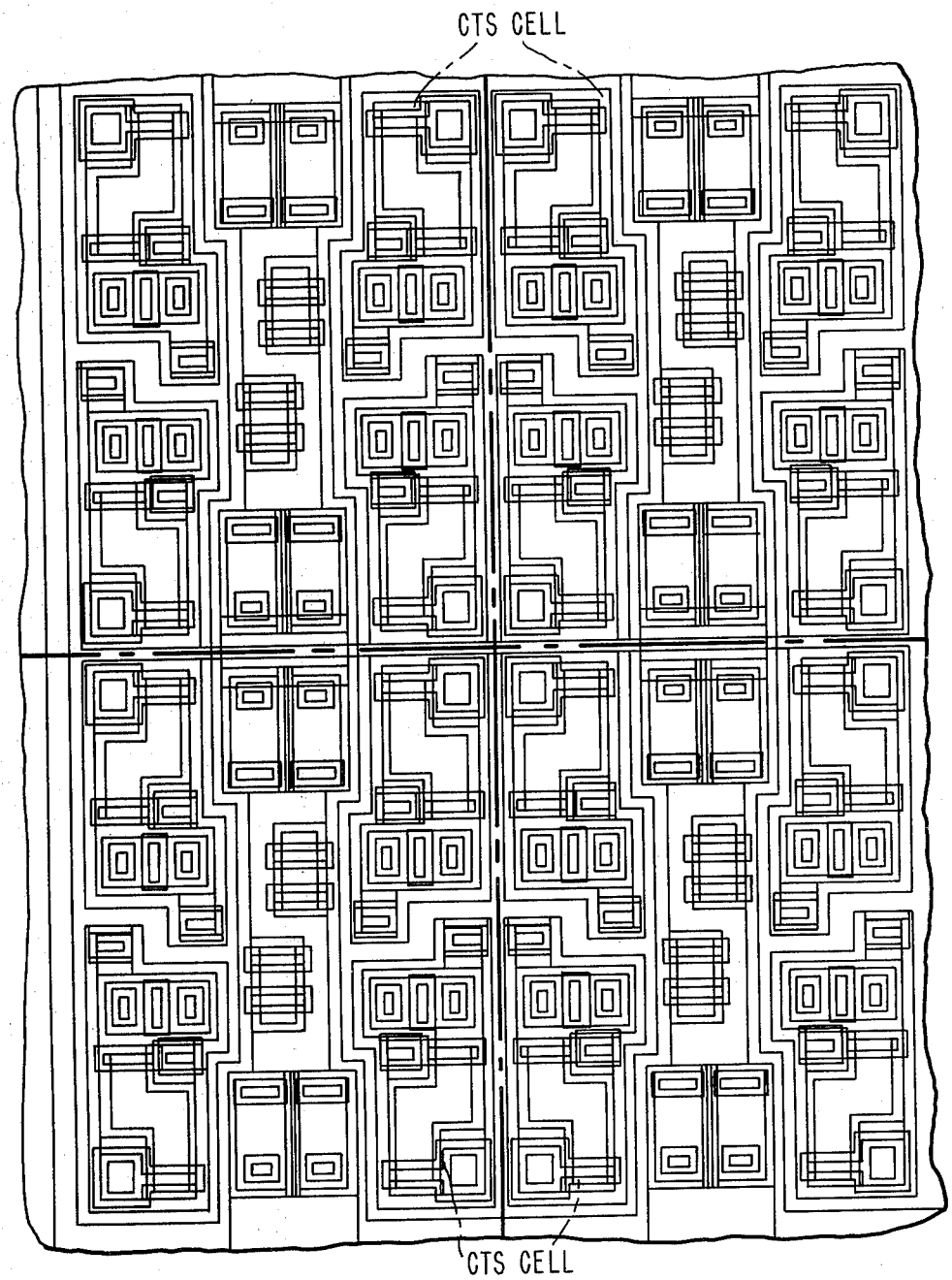

FIG. 14 is an enlargement of four Read/Write cells of the writeable control store of FIG. 13.

Figure 15:
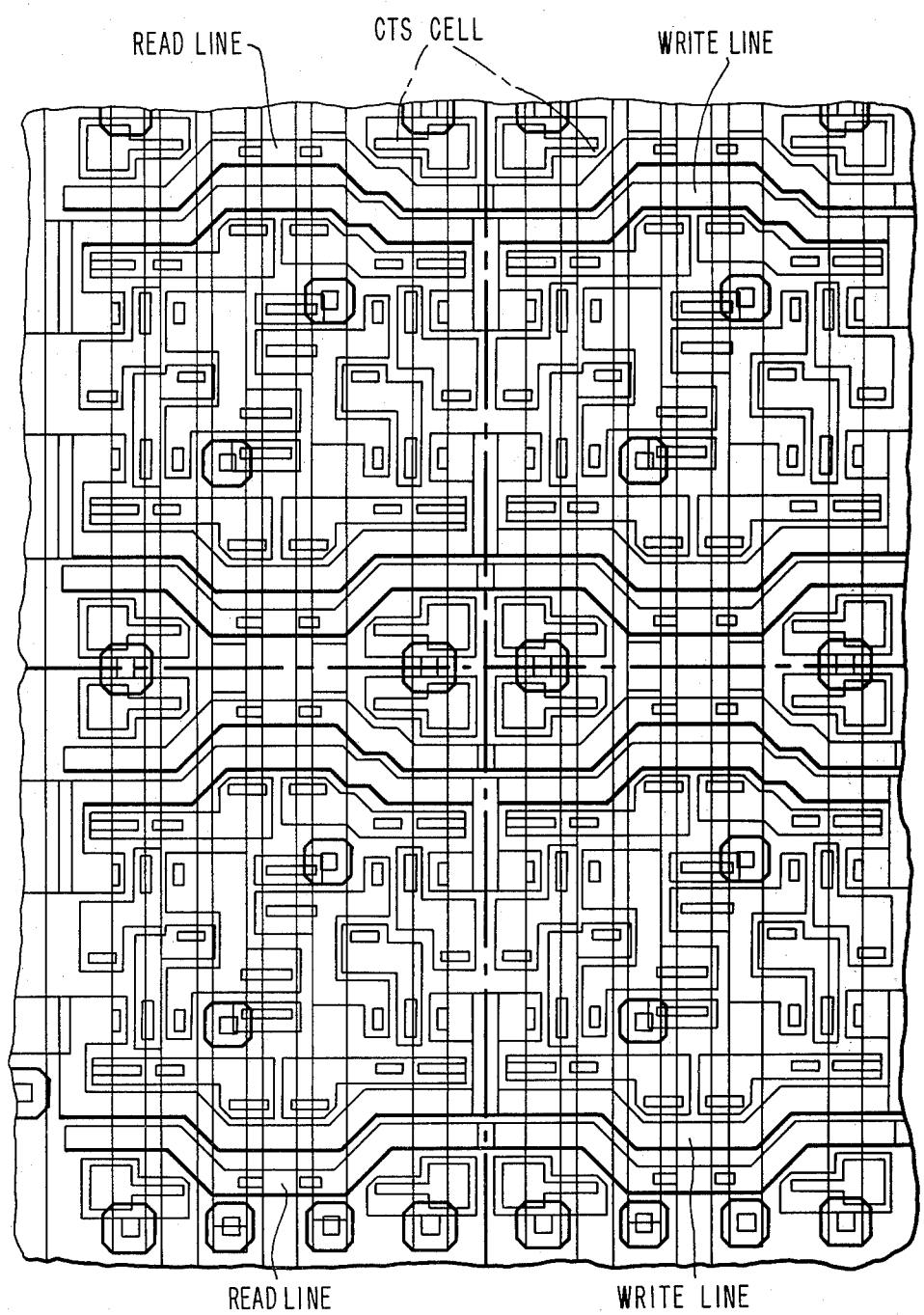

FIG. 15 corresponds to FIG. 14 with the addition of metallization.

Figure 16:
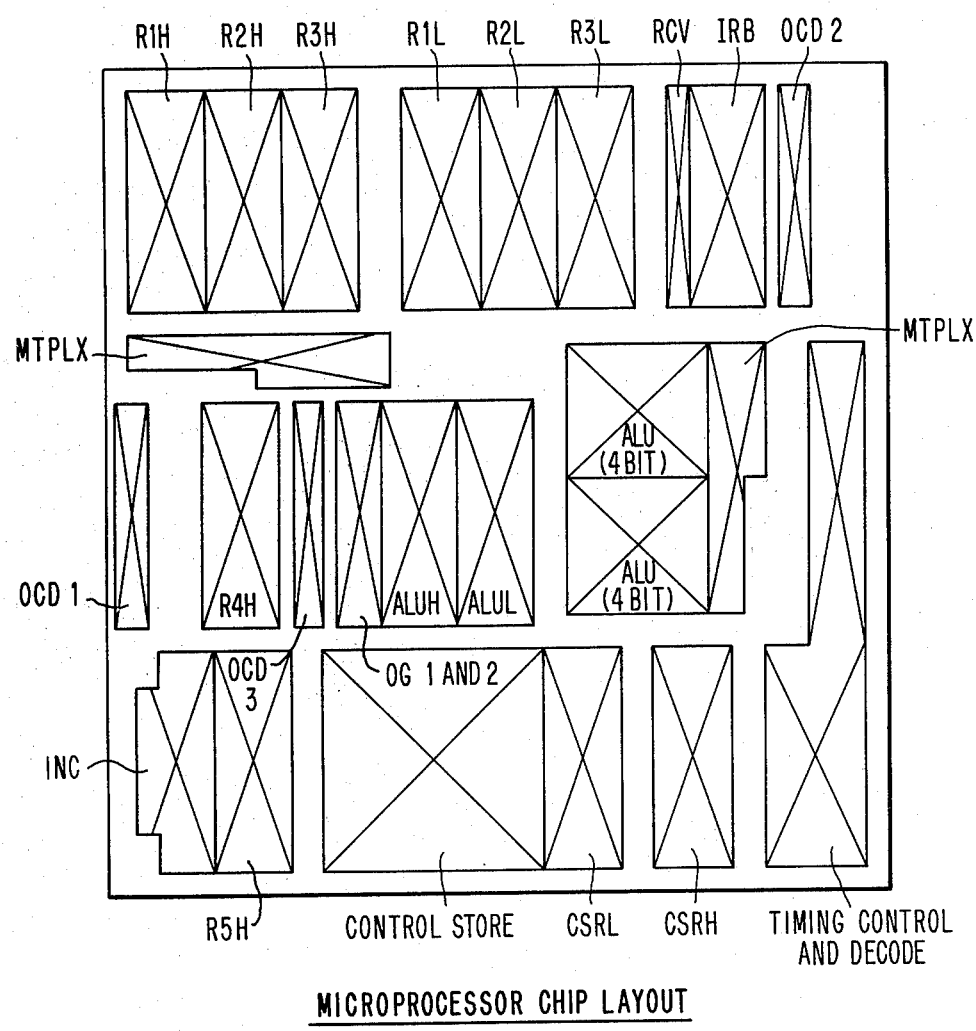

FIG. 16 shows the orientation on a semiconductor chip of the macros of the microprocessor illustrated in FIG. 5.

Figure 1:
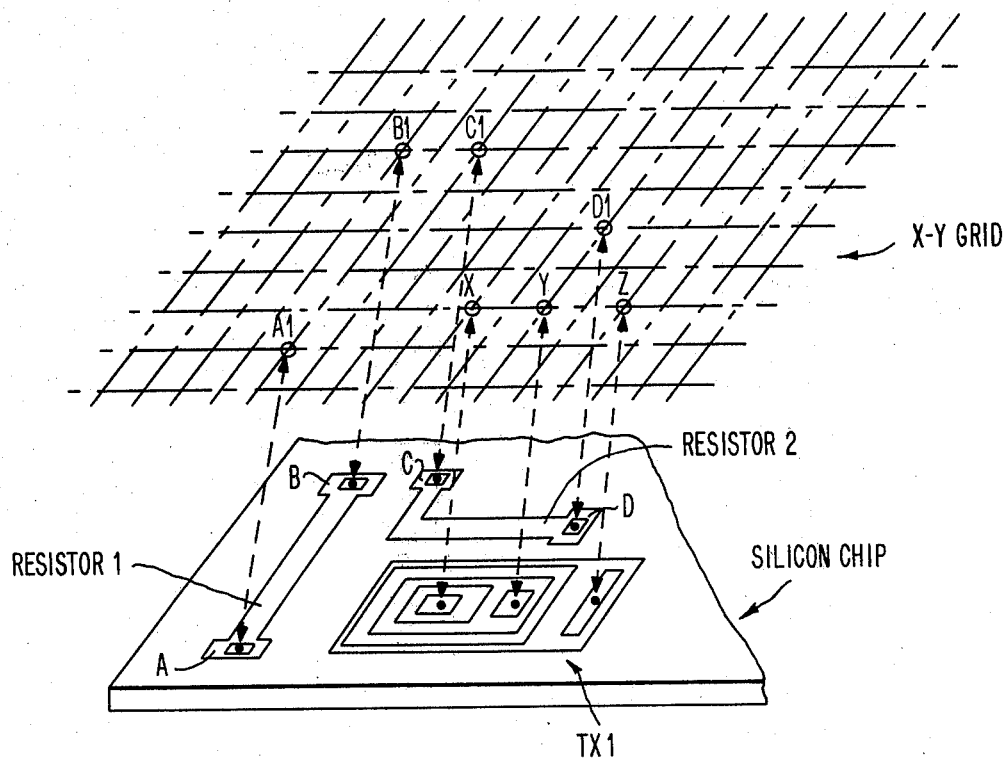
FIG. 1 illustrates a portion of an X-Y wiring grid superimposed over a portion of a semiconductor chip.

FIG. 1 is a description of how the X-Y wiring grid resides over the silicon chip. Shown in the silicon chip are two resistors and one transistor. Of note in this drawing is how the connection points to both resistors and the transistor will line up with an intersections of the X-Y grid.

Figure 2:
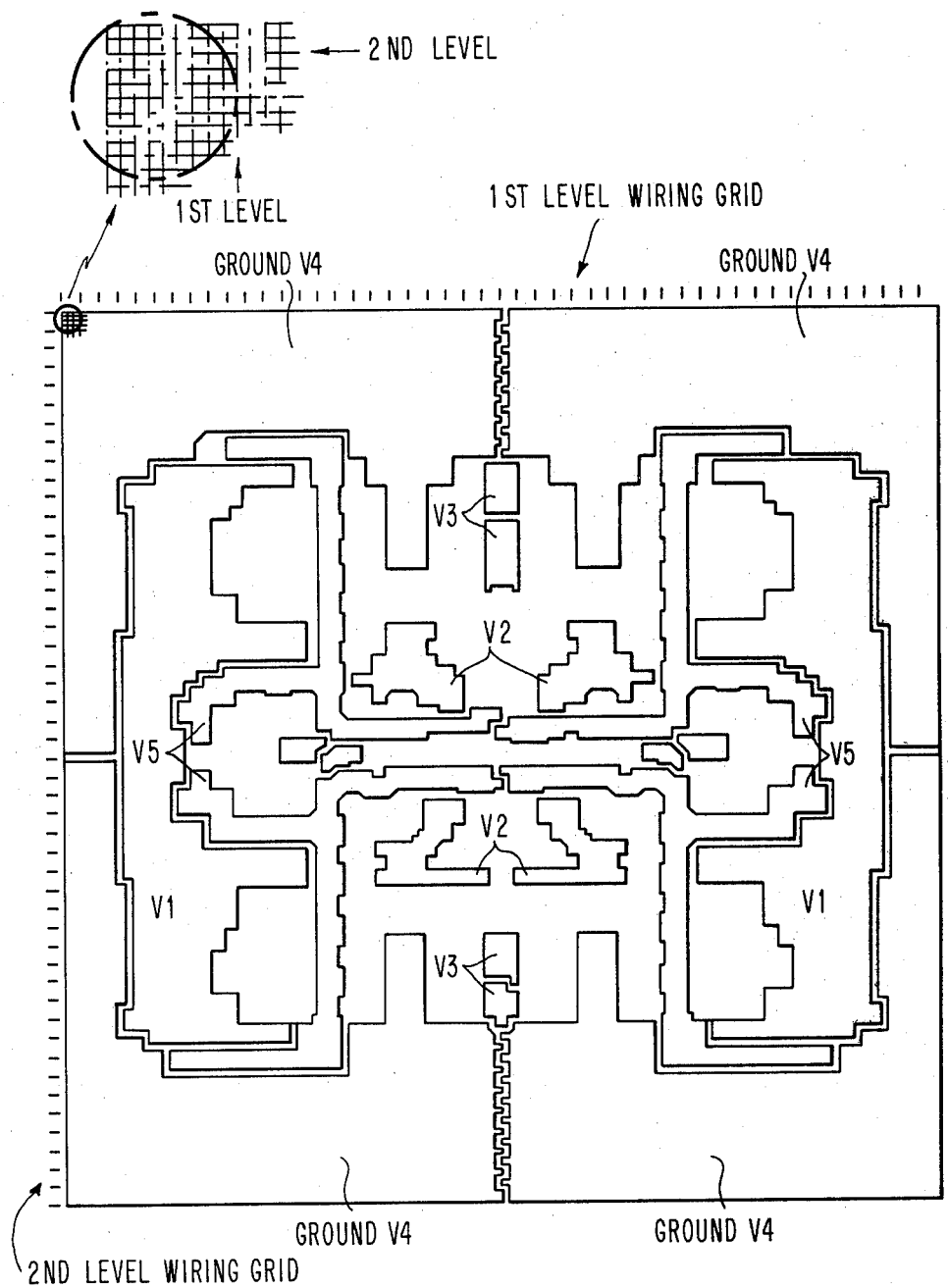
FIG. 2 illustrates or depicts a representative metal power plane distribution layer. The enlarged insert in the upper left hand corner of FIG. 2 depicts the X-Y wiring grid which resides beneath and is insulated from the third level (power plane) of metallization.

FIG. 2 shows a copy of the power plane distribution that exists in our example for the third layer of metal. This is the layer of metal above the X-Y wiring grid previously shown in FIG. 1. The insert in the upper left hand corner depicts how the wiring grid with the intersection points resides underneath the power distribution. In this particular example, we have a total of five voltages distributed throughout the chip.

Figure 3:
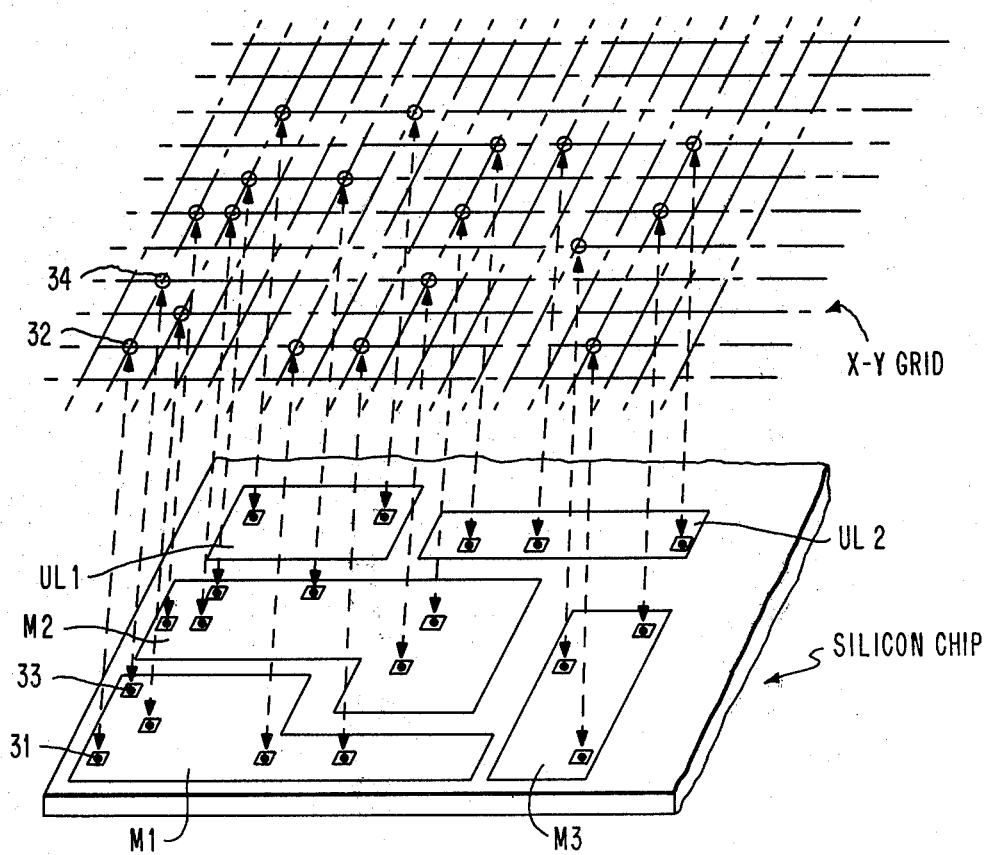
FIG. 3 is an extension of FIG. 1.

FIG. 3 is similar to FIG. 1 in that it depicts how the X-Y wiring grid resides above the silicon chip and the correspondence in space of the intersections of the X-Y grid for all contacts to the silicon chip. In this case, rather than particular components being shown, groups of logic are depicted as rectangles. The UL1 and UL2 rectangles represent a block of unit logic with their representative input and output ports. The M1, M2, M3 represent macros or clusters of unit logic and their respective inputs and outputs.

Figure 4:
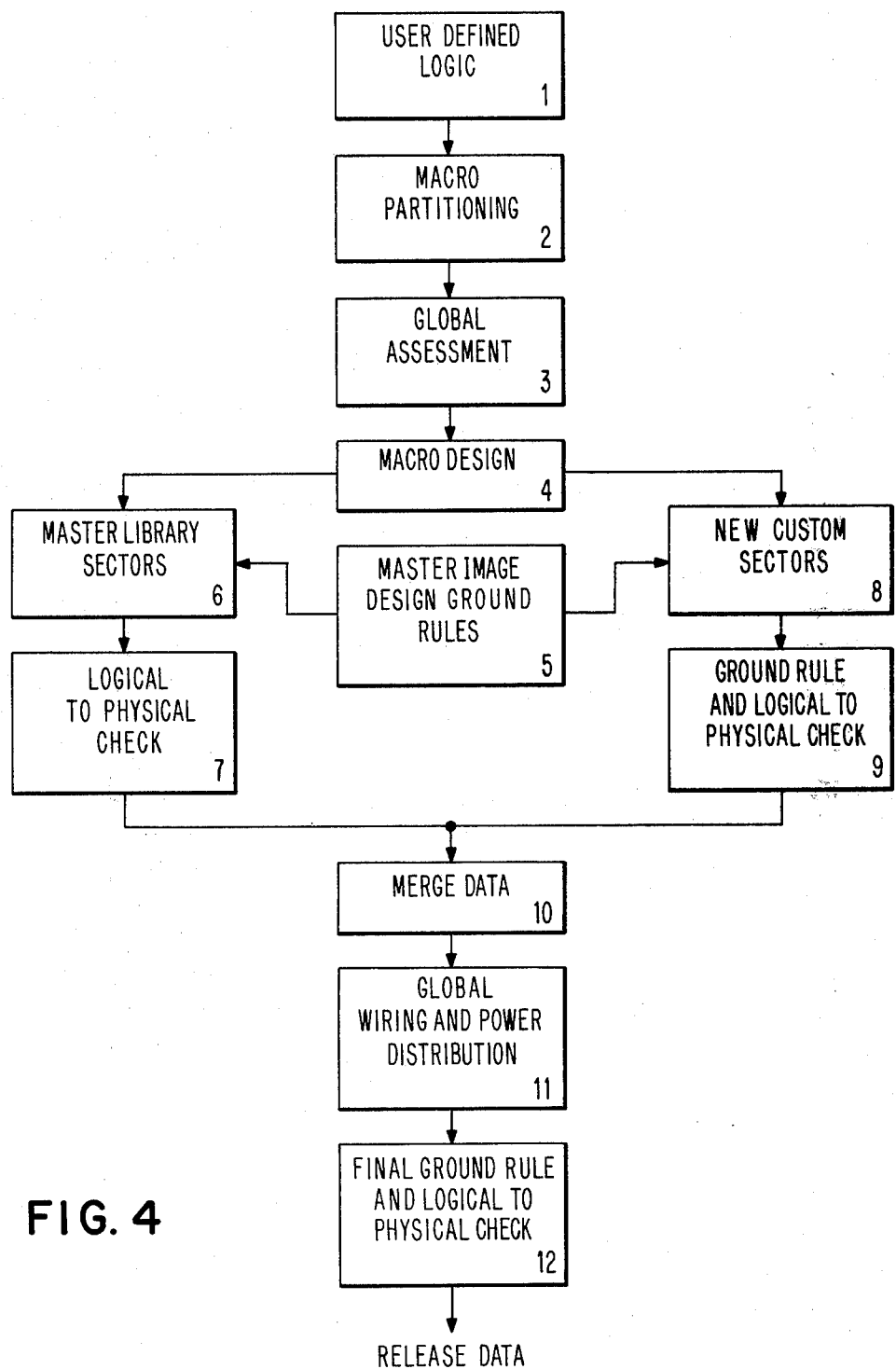
FIG. 4 is a block diagram or flow chart utilized hereinafter in a detailed explanation of the practice of the invention, Master Image Chip Organization technique or Method.

FIG. 4 is a block diagram or flow diagram of how a designer or engineer would design using the master image design technique as its base. Block 1 represents the defined logic input from the potential user. This would be input in the form of logic diagrams and interconnection net lists, and timing diagrams that spell out the logic to be performed. Block 2 is the first step performed by the designer. That is, the partitioning of the logic into macros or groups of functional logic. All functions of the microprocessor, which is our example in this case, are broken out into their respective macros. In our case, macros such as registers, arithmetic unit, multiplexor, parity checking, timing circuits, etc., are each broken into their respective macros. These macros are then given a form factor that is grossly representative of what their final design would be. Utilizing these gross sizes a global assessment, block 3, is made of how these functional units would interact with each other from a wiring standpoint. This is referred to as a global assessment, and allows for the placement of the macros and the gross assessment of their wiring interconnection. This enables the designer to come up with a gross assessment as to the final size of the chip.

Block 4 relates to the actual macro design. Two paths occur in macro design. One path, block 8, refers to new macros requiring design. These new macros are independently, off line, designed from the silicon up into their respective circuit types. For example, our register macros are designed in current switch emitter follower circuits, our arithmetic unit was designed in $T^2L$ circuits, our control and timing was designed in STL circuits. These are designed independently but following the design guide rules that are inherent in the master image design methodology.

The other path, block 6, refers to previously designed macros already existing within our master library. In our case, the arithmetic logic unit had already been designed for a previous chip. That macro was used as is for our design. In the case of the master library macros we do a logical and physical check, block 7, to guarantee that the data as stored is correct. In the case of the new custom sectors, automatic checking, block 9, is done to check the design against ground rules for physical design and also a logical to physical check to guarantee that the physical design does in fact match the initial user defined logic.

Block 5 in the center represents the design ground rules which are previously established rules stating the spacing of the X-Y grid, and the actual chip size and the voltage distribution that resides over it.

At this point we go to block 10 where the data from the new custom designs and the data from the library sectors are merged together to form the final data for the entire chip. In this case we now have the logic design and intramacro connections for each of the macros. These are entered into an automatic program, block 11, creating a placement of the macros, and intermacro wiring (between macros), as well as opening up the power and signal vias to the third level.

At the completion of block 11 our chip is totally designed. The total chip then is once more run through a final ground rule and logical to physical check, block 12, to guarantee correctness of design. We are ready to order masks from manufacturing.

FIG. 5 is a logic block diagram of a typical microprocessor. The microprocessor is capable of performing a number of known functions specifically including the following: AND, OR, EXCLUSIVE-OR, ADD, SUBTRACT and SHIFT LEFT or SHIFT RIGHT operations. The block diagram is a depiction of the macros or functional clusters (functional circuits) in which this microprocessor was broken up in order to be designed in the master image design methodology. If we look at the blocks, RCV is our receive circuits for the data bus. Directly below that is a string of registers, the R1H, R2H and R3H represent the registers for the high side of the output of the arthimetic unit, R1L, R2L and R3L of the low side. IRB is our input register buffer from our receiver circuits. Directly below that is a multiplexor for input to the low side of the ALU. The next block, the Arithmetic Logic Unit, is an 8 bit arithmetic unit designed in our case using two previously designed 4 bit units. Directly below that are the two arithmetic output registers of the high and low side, ALUH and ALUL. From there there are two special outgating or OG gates (OG1 and OG2) for gating of the outputs back into the high and low registers. The blocks OCD1, OCD2 and OCD3 represent our off chip drivers for our data output. On the lower left is an additional multiplexor, its associated register, R4H, and incrementor (INC) and its associated register, R5H. On the upper right is the control macro, its associated high and low side registers CSRH and CSRL, respectively, and the timing control and decode macro.

Figure 6:
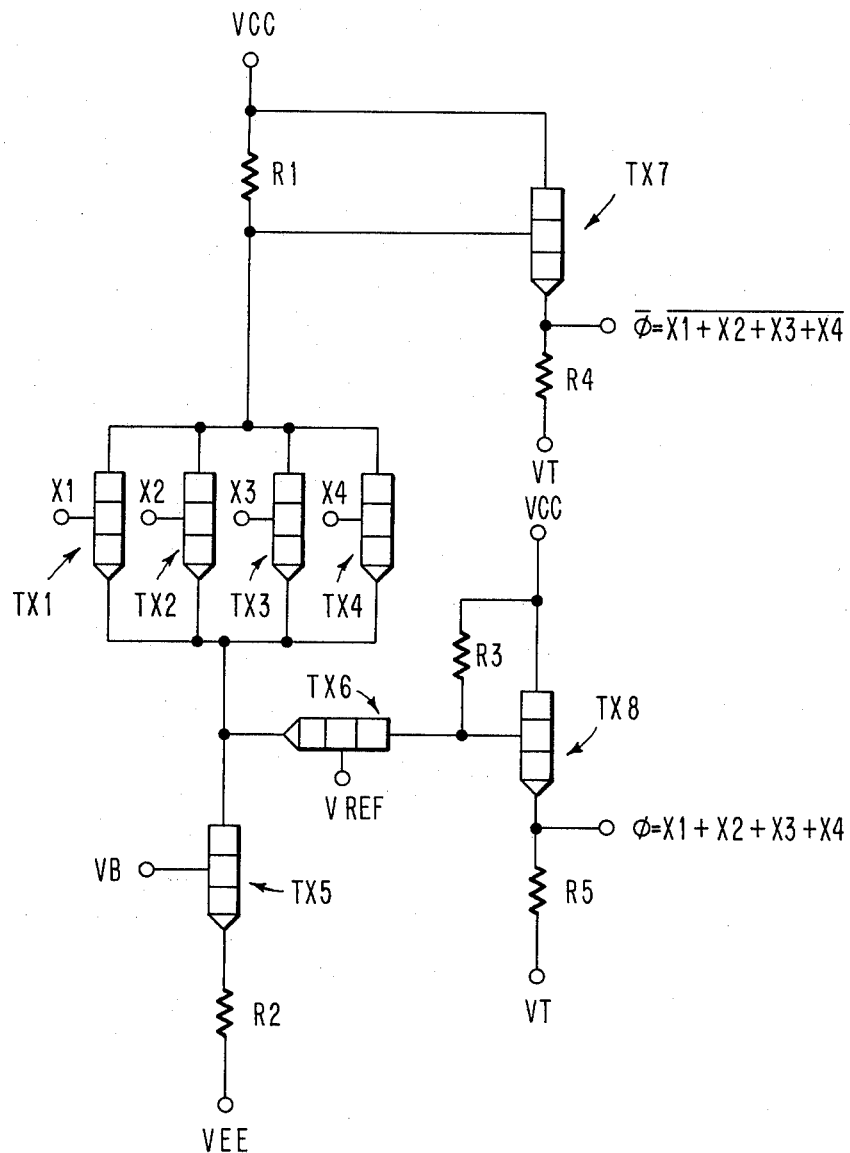
FIG. 6 is a circuit diagram of a current switch emitter follower circuit.

FIG. 6 is a circuit diagram of the basic current switch emitter follower circuit with both an in-phase and out-of-phase output; and as you can see it is a four input, two output, typical current switch emitter follower circuit.

Figure 7:
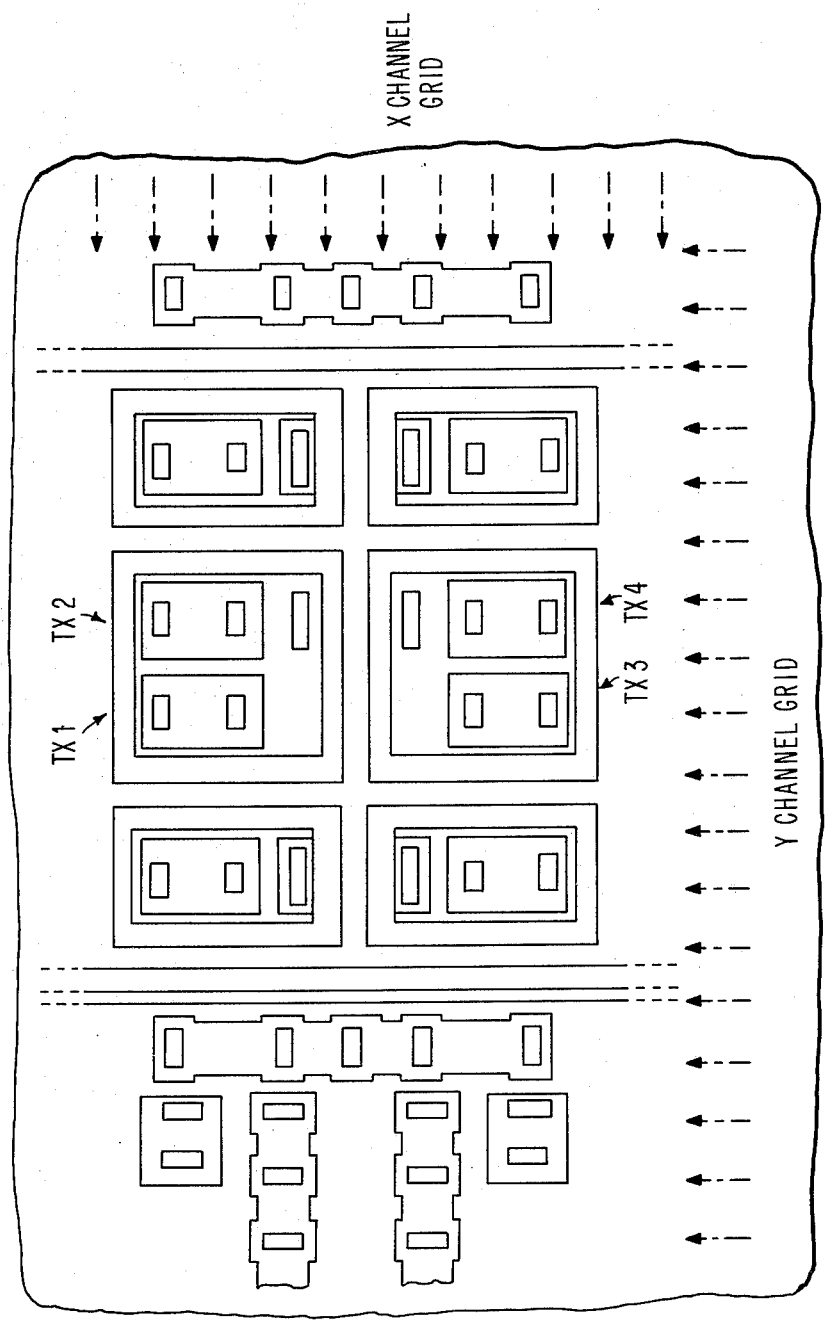
FIG. 7 is a planar layout of the current switch emitter follower of FIG. 6.

FIG. 7 is the layout of the current switch emitter follower circuit without any interconnection wiring. The components shown are the transistors and resistors which comprise the circuit. The arrows to the right and below the circuit represent the X and Y wiring channels. All inputs and outputs for this particular circuit occur at intersections of the X and Y channels.

Figure 8:
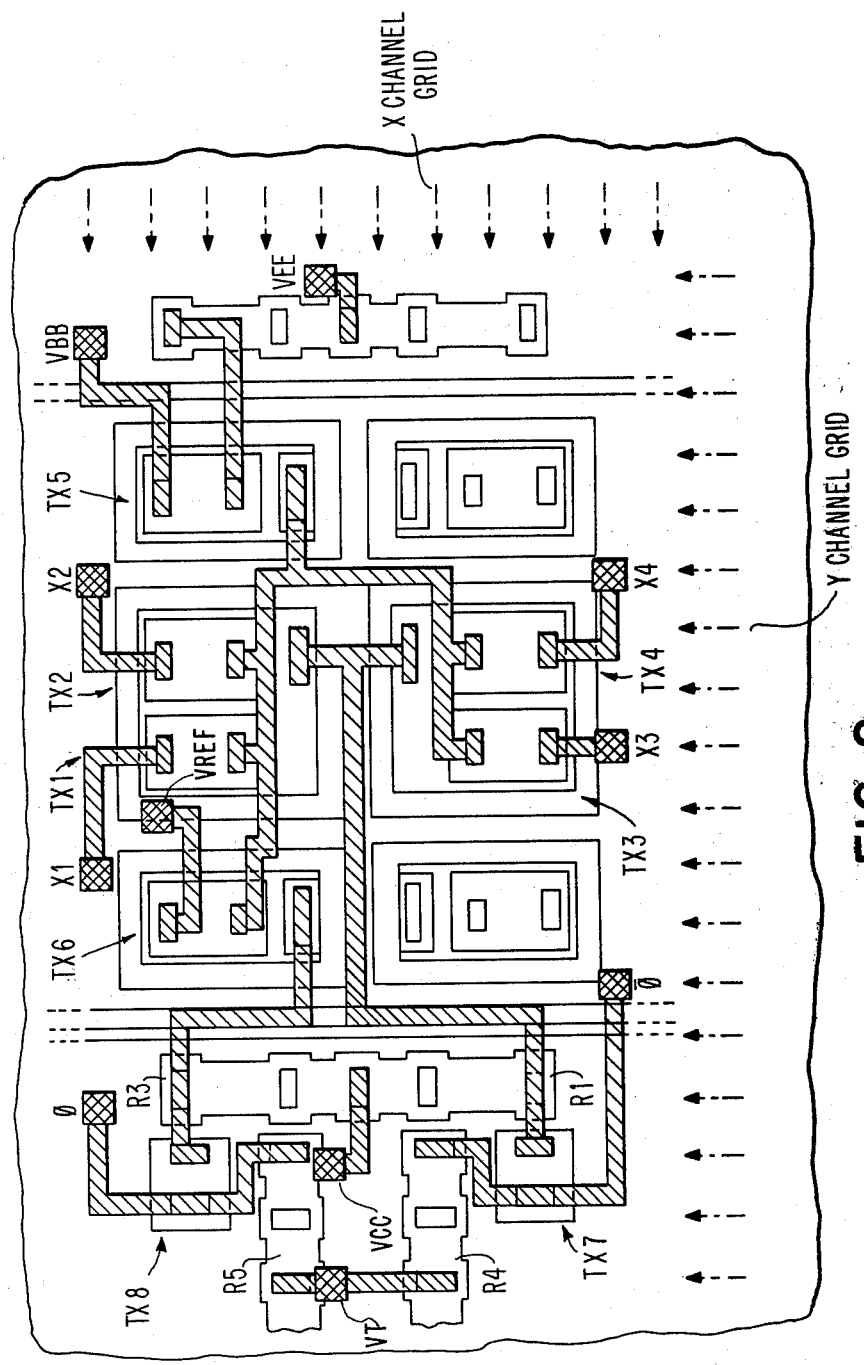
FIG. 8 is a further planar layout of the current switch emitter follower circuit of FIG. 6 and expressly showing first level metallurgy.

FIG. 8 represents again the same circuit as shown in FIGS. 6 and 7. Only here the interconnections are made between components to connect the circuit up in its functional form. It can be seen that we have four inputs, namely X1 through X4, the in-phase output represented by $\phi$ and an out of phase output by $\bar{\phi}$. The voltage connections are also shown on the ports (also termed LSTs and personalized contacts) where they will connect through to the voltage plane (third level). Again, note that all inputs and outputs line up at intersections of the channel (X-Y) grids. Namely, the ports X1, X2, X3, X4, $\phi$, $\bar{\phi}$, VT, VCC, VBB, VEE and Vref are respectively in alignment with an X-Y grid intersection.

FIGS. 9, 9A and 9B depict the Schottky Transistor Logic (STL) circuit layout used in our timing and control circuits. FIG. 9 specifically is a layout of four STL cells or circuits. Each cell consists of a transistor TX11, 2 resistors Rb and Rc and 6 diodes, S1 through S6, as shown in FIG. 9. In other words, four of these circuits reside in the cell layout shown in FIG. 9. FIG. 9B is a logic diagram used to depict the STL circut of FIG. 9A. Namely, a one input, five output inverter block. It is to be appreciated that although six diodes, S1 through S6, are shown, in the preferred embodiment of this invention only any four of the six diodes of a given cell are utilized.

FIGS. 10 and 10A depict how four cells such as shown in FIG. 9 can be interconnected to form a four way AND-OR-INVERT circuit. FIG. 10A is the logic representation of this circuit. FIG. 10 is the actual silicon layout with the interconnection metal shown. Again in this case, note that each of the ports into and out of the circuit will line up with an intersection of the X and Y grid.

FIG. 11 is the circuit diagram used for our control STORE. Since we are using a READ/WRITE cell in this embodiment it functions as a WRITEABLE CON- TROL STORE. It is a typical random access memory type cell in which we can change the micro coding used to control the microprocessor.

FIG. 12 shows a portion of the silicon layout out of this array cell. Shown is two full cells as they would be laid out within the macro. Note that the READ line and WRITE line are not shown with interconnections outside of the macro, due to the fact that the read and write line are common lines that run throughout the entire macro and are brought up to the X-Y grid only at the edges of the macro.

FIG. 13 is the actual layout of the entire control store macro without the metallization. As can be seen the array of READ/WRITE cells is located in the center of the macro and the addressing and output circuits are along the periphery of the macro. Not shown here are the ports as they pop up at the intersections corresponding to the X-Y wiring grid.

FIG. 14 is an enlargement of a four cell section of a control store macro without its wiring interconnection. As can be seen it is just a larger section as previously shown in FIG. 12.

FIG. 15 is an enlargement of the four cells with the metallization pattern included. It can be seen that the read and write lines are continuous lines that run through the entire macro and their outputs to the other macros in the microprocessor occur at the periphery of the macro (X, Y grid intersections).

FIG. 16 depicts the macro layout of our microprocessor chip. Each macro is shown in its relative size and positional relationship to all other macros. Each of the macros has been placed dependent upon its interconnection complexity with its neighboring macro. As shown, the R1H through R3H registers all reside closely together as do the low side registers R1L through R3L. This placement is preferably done by an automatic program residing within the Engineering Design System (E.D.S.). As you will note very little room is required between macros for intermacro wiring connections. Most of the intra-macro wiring occurs above the macros in the X-Y grid previously described with reference to FIGS. 1 and 3.

DESCRIPTION OF THE PREFERRED EMBODIMENTS OF THE INVENTION

A master image (MI) is a flexible image that allows the following to be personalized: (1) silicon diffusion levels; (2) voltage power bussing; and (3) circuit functions and interconnections.

The Master Image includes at least one uniform X and Y wiring grid. FIGS. 1 and 3 depict such a uniform wiring grid. X and Y wiring grids may exist on multiple wiring levels. For example, there may be more than one horizontal wiring grid and more than one vertical wiring grid for a given design. A uniform wiring grid means that the spacing between and wiring channels themselves are identical. This set of uniform wiring grids is sandwiched between silicon and a power surface. The uniform wiring grid resides over blank silicon while the power surface resides over the uniform wiring grid.

A specific example of the invention involves the case of three levels of metal. The top level, third level, is designated for power distribution and I/O redistribution. The other two levels are designated for wiring. Uniformly spaced horizontal (X) channels exist on the second level and uniformly spaced vertical (Y) channels exist on the first level. FIG. 2 depicts a representative third level residing over a uniform X-Y grid system. In order to personalize power distribution and the I/O connections access points to third level must be defined. These access points are defined by the joint intersection of the third level shapes residing over the intersections of X-Y wiring grid. The existence of these access points allows the power distribution and I/Os to be personalized on the uniform wiring grid. This is achieved by placing the required second to third level vias at the access points desired. As such, the third level power distribution is now brought to the second level. At the second level the power is routed horizontally for its desired distance. The power distribution is designed as multiple number of channels. Once having routed the power on the second level a first to second level via is placed where power is required on the first level. The first level shape which is also a multiple of wiring channels, is routed to the appropriate circuit position. At that position, the silicon contact is opened to enable the power to make contact with the silicon. Likewise the I/O signal connections are similarly routed. The fine wiring grid allows voltage and I/O distribution systems to be designed as an integral number of channels. The distribution configuration is very flexible because (1) voltage busses can be placed with more options and (2) the size (cross-sectional area) of the busses can be optimized for actual conditions of the part number. Both the power and I/O signal connections are routed to end points which ultimately get terminated in the silicon. These end points are defined as power signal LST (Logic Signal Terminal) points of a functional unit. A functional unit may be comprised of micro logic circuits as well as a macro. A macro may be a RAM, PLA, Selectro or Decoder.

A functional unit micro or macro has a set of components interconnected. These connections within the functional unit will be referred to as intra connections. These connections are accomplished using any of the uniform wiring grid levels. The connections between functional units, interfunctional connections, likewise are accomplished using the uniform wiring grid. The functional units comprised of multiple silicon diffusions are located anywhere on the chip. Access points to each functional unit is defined by LST points. These points rigorously reside at the X-Y grid intersections. They may exist at the silicon level, first level or second levels. FIG. 3 depicts in part a chip design comprised of unit logic clusters and macros and their corresponding LST access points. [Note that the Logic Signal Terminals (LST's) respectively coincide in space with an X-Y grid intersection].

A standard MS (masterslice) technique has a fixed limit on the number of internal circuits, and external circuits. In accordance with the invention the ability to optimize each functional unit for performance and density, and place it almost anywhere on the chip increases the density, performance and overall chip utility. By having the functional units LST's rigorously align themselves with the uniform (X-Y) wiring grid intersections the functional unit placement on the image is very flexible.

FIG. 4 shows a block diagram representation of the master image design methodology. We will use this methodology to construct a typical microprocessor chip. This chip is composed of several different blocks of functional logic entities or macros. A block diagram of this typical microprocessor chip is shown in FIG. 5.

Before we begin the actual design of the chip it is necessary to establish a set of Master Image Design Groundrules. These design rules act as the master rules that oversee the entire design. Referring again to FIG. 2, we see illustrated the master image voltage distribution for a given chip (third level metal). Also the insert depicts an enlarged portion of the X and Y grid coordinates (underlying the third level metal) for this chip. Grid spacing and line widths are also selected at least in part based upon the process tolerances. Each small box or window formed by the intersection of X and Y channel grids represents the smallest unit of measure for a complete circuit or group of circuits. In other words, each circuit or macro must be designed as a multiple of these small units or windows. In addition, all connections to each circuit or macro that must be made from outside the circuit or macro must occur at an intersection of an X and a Y grid. (It also is to be appreciated, as stated hereinabove, that the wiring respectively represented by X grid and Y grid are separated and spaced from one another by an insulating layer, such as silicon dioxide).

With these rules in place, it is now possible to begin our design. First, the user logic (FIG. 5) is broken down into its function (logic) blocks or macros. Once the macros are determined, performance and physical size characteristics are examined to determine the optimum circuit to be used (performance criteria) and circuit size (physical criteria). Once this is determined a rough cut or estimate is made to determine overall macro size (multiples of window size). FIGS. 6, 7, 8, 9, 10 and 12 depict the different circuit families chosen for the different functional logic entitles for our typical microprocessor chip. As can be seen, a number of different circuit families have been selected.

[It is to be appreciated that, as is well known in the art, although each of the design steps may be carried out manually, the preferred approach is to utilize as an aid or tool an Engineering Design System (E.D.S.). Numerous such systems employing a data processing system and varying in scope of functions performed, are known to the art. The Electronic Design System "per se" forms no portion of the disclosed invention and as such no further discussion thereof is deemed to be in order or necessary].

Once each macro size has been estimated, automated programs are used to determine the best placement of these macros in relation to each other to achieve a minimum chip size. A number of iterations are usually required to do this since the form factor of each macro may be varied in order to get the best possible "fit". At the completion of the global assessment, overall chip size has been determined as well as the approximate location of each macros' inputs and outputs in relation to its physical size and form factor. This information is essential when designing each individual macro.

The macros themselves can now be individually designed, by different designers if necessary, to fit within the predetermined size and form factor (or smaller). Inputs to and outputs from the macros are designed to correspond as close as possible to the approximate locations determined above, however, the inputs and outputs must rigorously be spaced to occur only at the intersections of the previously determined X-Y grid. In our microprocessor chip, a previously designed 4-bit ALU macro is used twice, to provide an 8 bit ALU. The 4-bit ALU macro was taken from our master library. The remaining macros were custom designed.

Referring to FIG. 6, all the registers, register gating, and parity check circuits were designed using a $T^2L$ compatible current switch emitter follower circuit. FIG. 7 depicts one of these circuits. The X-Y wiring grid is shown by the small arrows to the right side and below the planar view of FIG. 7. In the case of VEE and VCC lines it was determined that a single line width was not sufficient for electrical power distribution. Therefore, it is two channels wide. If greater width had been required, it would be designed at some multiple of standard width.

Referring to FIGS. 7, 8, 9, 10 and 12, it can be seen, that inputs to and outputs from each circuit always occurs at the intersection of X and Y grid intersections. As multiples of these circuits are put together to form a macro, this rule continues to apply such that when the macro design is completed, all inputs to and outputs from the macro only occur at the intersection of the X and Y grid.

Each of the other macros are designed in a similar fashion regardless of the circuit family selected. With regard to the logic circuits used, one can consider each of the macros as being a "mini-master-slice". Each particular macro is designed under the same master image ground rules. In this way, current state-of-the-art automatic placement and wiring programs can be used to design the macros.

The array macros, however, are normally custom designed for a particular function. In our case, a small random access memory macro is used for a control store. Other array macros, such as a PLA or ROS, would be designed in the manner described above. FIG. 11 depicts the particular read/write cell selected and FIG. 12 the read/write cell layout. This macro was custom designed from scratch, again following the master image ground rules relative to the alignment of the X-Y grid intersections and I/O's. FIGS. 13, 14 and 15 depict the component layout and wiring complexity of this macro.

Each macro as it is designed goes through a complete set of checking programs. This includes a topological ground rule and shapes check as well as a logical to physical check.

Since each macro was designed under the surveillance of the master image design ground rules, it is now a relatively simple and straightforward matter of describing the macro to the design system in terms of X-Y grid points. Each macro has an origin at some X-Y grid coordinate and all inputs, outputs and blocked wiring channels can be described to the system in terms of the same X and Y grid. This allows the Engineering Design System (EDS) to easily merge the data and perform the final automatic placement and intermacro wiring of the chip. A final ground rule and logical to physical check is made of the entire chip and the design is ready for mask build.

Set forth hereinafter is a yet more detailed description of the preferred embodiment of the invention. It is to be appreciated, however, that our invention, Master Image Chip Organization Technique or Method, is not to be construed as limited to the fabrication of a Microprocessor. As will be apparent to persons skilled in the art, our invention may be advantageously practiced to provide a wide variety of functional Large Scale Integrated (LSI) circuit devices.

In the illustrative embodiment of our invention structured logic master image chip organization is utilized to design a microprocessor chip. If we refer to FIG. 5 we find the logic block diagram of the microprocessor to be designed. Here we see the various functions of the microprocessor shown as functional macro blocks along with the major data busses. As can be seen, there are numerous functional macro blocks. For example, the R1H, R2H, R3H represent the high bit data registers and R1L, R2L, R3L, are the low bit data registers. The microprocessor organization is typical of most microprocessors capable of doing functions such as AND, OR, EXCLUSIVE-OR, ADD, SUBTRACT, SHIFTING LEFT and RIGHT, etc. One advantage of the master image organization is that a number of designers may independently design the different functional macros of which the microprocessor is composed. They design these macros with strict adherance to the design rules of the structured logic master image organization. When each of the macros has been completely designed and checked, only then are they brought together and interconnected in a chip. This is also controlled under the structured logic master image chip organization design rules.

To illustrate how this is done, let us refer to FIG. 1. FIG. 1 shows how we would interconnect components on a master image, that is, we would locate the connecting ports to each of the components at an intersection of a rigid X-Y grid. Referring to FIG. 1, it can be seen that the two ports of resistor 1, namely A and B, would intersect the X-Y grid at points A1 and B1 on the grid. Similarly, with resistor 2, the end points C and D would connect at the intersections of the X-Y grid at points C1 and D1. Transistor, TX1, also shown has its ports base, collector and emitter intersecting at points X, Y and Z on the fixed grid.

Referring to FIG. 3, we see five enclosed areas representing either a circuit or a group of circuits, UL1 and UL2 represent circuits, M1, M2 and M3 represent groups of circuits of macros 1, 2 and 3. These macros are similar to those in our microprocessor, such as a register, arithmetic unit, a control store or some other functional macro. Looking at macro M1 we can see that point 31 of the macro, which could be either an input or an output, would line up with the X, Y grid intersection, point 32. Similarly, point 33 on M1 would line up with point 34 on the X-Y grid. In each case inputs and outputs from the macros coincide with an intersection point of our standard X-Y grid. Keeping this in mind and referring back to our microprocessor block diagram (FIG. 5) we can look specifically at one of the register macros, let us say for example, R1H. The designer, knowing the logic description of that register, would select the circuit that best fits the application and design that macro in accordance with the Master Image design rules completely by itself.

In the case of our register macros, the circuit selected is a current switch emitter follower, primarily due to the fact that a current switch emitter follower has the capability of readily providing both the in-phase and out-of-phase outputs. Thus a minimum number of circuits are required to provide a register. The same circuit family is used for register outgating and for parity checks on the register. The designer then took that logic, designed it off line maintaining an absolute minimum spacing, minimum size of his macro. At the same time keeping his inputs and outputs at intersections of the predefined X-Y grid. Similarly, another designer taking the logic required for the multiplexor, would select circuits for the multiplexor and design the minimum size macro for the multiplexor based upon circuit type and semiconductor ground rules. Again, adhering to the same X-Y grid coordinate for his placement of inputs and outputs. In this way each of the macros shown in FIG. 5 are designed separately and independently from the other but under the control of the master image ground rules. These ground rules include a predefined X-Y grid at which all inputs and outputs to and from the macro must occur. In our case different circuits were selected for different functions. For example, the registers, register gating and parity circuits, as previously stated, were designed using current switch emitter follower circuits mainly because of the requirement for two phase output from the registers. The arithmetic logic unit and parity predict circuits associated with the arithmetic logic unit were designed in typical $T^2L$ circuit family. The main reason for this is the fact that a particular macro had previously been designed for another application that fit the requirements of our microprocessor. The control circuits, the incrementer and the multiplexor were all designed using IBM STL circuits. [U.S. Pat. No. 4,294,193 granted Feb. 3, 1981 fully identified hereinabove]. The reason for this is the STL circuit has a very narrow form factor and can easily be matched up with the larger macros to facilitate placement. It also allows for ease of non-rectangular designs. The control store macro is basically a random access memory or a writeable control store. The complementary transistor switch or CTS cell was selected with support circuits in a current switch family. This was done because of the small size of CTS cell and its performance. Off chip drivers and receivers were of special custom design. However, their outputs and inputs are compatible with typical $T^2L$ family circuits. This is due to the reason that these circuits must interfere with other parts of the system surrounding the microprocessor.

Referring to FIG. 4 we can see how this microprocessor was designed. The first block namely, user defined logic, is the input that the designer receives. This consists of the microprocessor logic block diagram, as shown in FIG. 5, as well as the timing and performance requirements. It is here that the designer decides the type of circuitry he requires and how he wants to organize his macros. Once he has made this definition, automatic partitioning programs are preferably used to partition the logic to its functional blocks. As can be seen in our case, the functional blocks were pretty well predefined due to the fact that a microprocessor consists of macro blocks more or less accepted in the industry as depicting certain functions. After the circuit family is selected, the designer roughly estimates the size and shape of his final design. Once he has done this he then can go to the automatic wiring program, code in his gross macro outlines, and assess the amount of interconnection between the various macros or the amount of intermacro wiring. This gives him then the rough idea of the size chip he will require. The actual design can now be assigned to a number of macro designers.

When we get into the macro design each of the macros can be designed, if necessary, by a different designer. All of them, though, are under control of the master image design ground rules. As each macro is designed, it is then checked for both ground rule and logical to physical correlation to guarantee that the design does, in fact, meet the physical ground rules for chip design as well as match the logic as defined by the user. Also a search is made of the master library to see if previously designed macros are sufficient to support the needs of this particular set of logic. In the case of this microprocessor, a previously defined arithmetic logic unit was selected since it met the performance and space requirements of this design. When all the macros have been designed, the registers, multiplexors, the unit timing and control, and the control store, they are then merged into a common data set. The data set contains all the physical and wiring information for all macros. Using programs residing in EDS, a placement and wiring run is done to place these macros on the raw silicon and to route the intermacro wiring. In addition, a power distribution analysis program assesses the power distribution requirements and pops up to the third level metal, the voltage distribution, the vias necessary to meet those requirements. At the completion of the automatic wiring program and the power distribution program, a complete chip has now been wired. The data base contains all the physical information as far as the macros and the silicon as well as the wiring interconnections. A final check is then made against design ground rules, as well as a logical to physical check against the initial logic. When this check is passed the data is now complete and we are in a position to order the masks.

In the case of our microprocessor we were able to break the work up amongst three designers. One designer doing all the register macros, another design engineer in charge of the control store and the remaining design engineer to do the miscellaneous, discriminator and multiplexor circuits. Output gating of our custom design was very similar to a previous design, although a small amount of work had to be done to tailor these particular output and input gates for the requirements of our particular microprocessor.

As previously stated current switch circuits were selected for the registers. FIG. 6 depicts the typical current switch circuit. FIG. 7 depicts the current switch component layout while FIG. 8 indicates how the metallization pattern was used to connect those components to create out standard four input, two output current switch. This was the basic circuit used to design all the registers in our microprocessor. Similarly, FIGS. 9, 9A and 9B depict the STL cell component layout and circuit diagram of that logic block. STL was used for our timing and control circuits, incrementer and for the multiplexors due to its very thin form factor. In this case we found it necessary to design with this very small form factor due to the constraints of overall chip size and the need to design the macros in other than a straight rectangular fashion. The STL cell is very valuable in this respect.

FIGS. 10 and 10A are merely a description of the STL cell and how it was wired to form a four way AND OR invert. Similarly, FIGS. 11, and 12 show the circuit that was selected for the control store in the microprocessor. In our case it was the CTL cell, with current switch emitter follower type addressing and control circuits. We see that both the layout and the interconnections for the CTL cell are shown in FIGS. 12, 13 and 14 and 15.

Referring back to FIG. 5 which shows the overview of our microprocessor functional parts, we can see that each of the functional units is found on the diagram. When the macro design was complete and entered into the system for placement and wiring, the automatic placement program placed these macros in their most advantageous position relative to the interconnection wiring between them. FIG. 16 illustrates how the placement program placed each of the macros. Referring now to FIG. 5 you will note that the R1H, R2H and R3H not only are functionally related but, due to their intermacro wiring, are physically related as well and are grouped together in the upper left hand side of the chip. Similarly, the other macros closely interrelated by the amount of interconnection between them are closely spaced to each other on the chip. FIG. 16 shows where each of the individual macros were placed on the silicon chip itself. At the completion of the placement program the automatic wiring program will form the wire interconnections between the macros. The preferred program used in our case is a program residing in the EDS system for automatic wiring and can be used due to the use of a standard X-Y grid. Most of the automatic design aids used in the master image approach have been derived from the standard masterslice organization design system. The end result of the design was an entire microprocessor designed on a single chip with highly dense circuit organization and very high utilization of the silicon on the chip despite the fact that a number of different circuit families were used in the microprocessor, they were designed in such a way as to interface properly with each other and to achieve the functional requirements of the microprocessor. Previous methods of designing the microprocessor would not have been as efficient. For example, when a masterslice approach was used, where areas of the silicon are dedicated for wiring, the density could not have been achieved as was in the case of using the structured logic master image. Similarly, a full custom approach, where each of the blocks is designed in a serial fashion, considerably longer time would have been required as well as an inability to use any of the existing wiring and partitioning programs.

To summarize, the master image design method allows for increased circuit density and silicon utilization while using existing design tools residing in EDS.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is our intention, therefore, to be limited only as indicated by the following claims.

Having thus described our invention, what we claim as new, and desire to secure by Letters Patent is:

1. In an improved planar semiconductor integrated circuit chip structure, said chip structure having:
   a surface from which a plurality of regions of different conductivity type extend into the chip to provide a plurality of electrically isolated functional circuits, each of said functional circuits including the required interconnected components to provide the function thereof;
   at least one of said functional circuits being a transistor-transistor logic functional circuit, at least one of said functional circuits being an emitter coupled logic functional circuit, and at least one of said functional circuits being a Schottky-Transistor logic functional circuit;
   an X pattern of equally spaced parallel conductors overlying and electrically insulated from said chip structure surface, said X pattern of conductors being minimally spaced one from another and selectively connected to at least selected certain ones of said functional circuits;

a Y pattern of equally spaced parallel conductors overlying and electrically insulated from said X pattern of parallel conductors, said Y pattern of conductors being selectively connected to at least selected certain ones of said functional circuits and at least certain conductors of said X pattern of conductors;

said X pattern of conductors and said Y pattern of conductors being orthogonal one to another and thereby geometrically manifesting an X, Y coordinate system;

said integrated circuit chip structure being characterized in that all connections between said X pattern conductors, said Y pattern conductors and said functional circuits exist in space only at X, Y intersections of said X-Y coordinate system geometrically manifested by said X and Y patterns of conductors.

2. In an improved semiconductor integrated microprocessor chip said microprocessor chip including:

a planar surface from which a plurality of regions of different conductivity type extend into the chip to provide a plurality of electrically isolated functional circuits;

each of said functional circuits including the required interconnected components to provide the function thereof;

an X pattern of equally spaced parallel conductors overlying and electrically insulated from said chip planar surface, said X pattern of conductors being minimally spaced one from another and selectively connected to at least selected certain ones of said functional circuits;

a Y pattern of equally spaced parallel conductors overlying and electrically insulated from said X pattern of parallel conductors, said Y pattern of conductors being selectively connected to at least selected certain ones of said functional circuits and at least certain conductors of said X pattern of conductors;

an additional pattern of conductors overlying and electrically insulated from said Y pattern of parallel conductors, said additional pattern of conductors being selectively connected to at least selected certain ones of said Y pattern of conductors;

said X pattern of conductors and said Y pattern of conductors being orthogonal one to another and thereby geometrically manifesting an X, Y coordinate system;

said integrated microprocessor chip being characterized in that all connections between said X pattern of conductors, said Y pattern of conductors, said additional pattern of conductors, and said functional circuits occur only at points in space corresponding to said X, Y intersections of said X-Y coordinate system geometrically manifested by said X and Y patterns of conductors, whereby fabrication utilizing an engineering design system is greatly enhanced.

3. In an improved semiconductor large scale integrated circuit chip fabricated in an automated system in accordance with a part number, said chip including:

a planar surface from which a plurality of regions of different conductivity type extend into said chip to provide a plurality of electrically isolated functional circuits;

each of said functional circuits including the required interconnected components to provide the function thereof;

an X pattern of equally spaced parallel conductors overlying and electrically insulated from said chip planar surface, said X pattern of conductors being minimally spaced one from another and selectively connected to at least selected certain ones of said functional circuits;

a Y pattern of equally spaced parallel conductors overlying and electrically insulated from said X pattern of parallel conductors, said Y pattern of conductors being selectively connected to at least selected certain ones of said functional circuits and at least certain conductors of said X pattern of conductors;

said X pattern of conductors and said Y pattern of conductors being orthogonal one to another and thereby geometrically manifesting an X, Y coordinate system;

said large scale integrated circuit chip being characterized in that all connections between said X pattern of conductors, said Y pattern of conductors, and said functional circuits occur only at points in space corresponding to said X, Y intersections of said X-Y coordinate system geometrically manifested by said X and Y patterns of conductors, whereby fabrication utilizing an automated system in accordance with a part number is greatly enhanced.

4. In an improved semiconductor large scale integrated circuit chip as recited in claim 3, wherein at least one of said plurality of electrically isolated functional circuits is a Transistor-Transistor-logic functional circuit.

5. In an improved semiconductor large scale integrated circuit chip as recited in claim 3, wherein at least one of said plurality of electrically isolated functional circuits is an emitter coupled logic functional circuit.

6. In an improved semiconductor large scale integrated circuit chip as recited in claim 3, wherein at least one of said plurality of electrically isolated functional circuits of said plurality of electrically isolated functional circuits is a Schottky-Transistor logic functional circuit.

* * * * *